United States Patent
Kang et al.

(10) Patent No.: US 7,081,409 B2
(45) Date of Patent: Jul. 25, 2006

(54) METHODS OF PRODUCING INTEGRATED CIRCUIT DEVICES UTILIZING TANTALUM AMINE DERIVATIVES

(75) Inventors: Sang-Bom Kang, Seoul (KR); Jong-Myeong Lee, Gyeonggi-do (KR); Kyung-In Choi, Seoul (KR); Gil-Heyun Choi, Gyeonggi-do (KR); You-Kyoung Lee, Chungchoungbuk-do (KR); Seong-Geon Park, Gyeonggi-do (KR); Sang-Woo Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/877,848

(22) Filed: Jun. 25, 2004

(65) Prior Publication Data

US 2004/0235285 A1 Nov. 25, 2004

Related U.S. Application Data

(63) Continuation-in-part of application No. 10/425,276, filed on Apr. 29, 2003, now Pat. No. 6,815,285, and a continuation-in-part of application No. 10/411,949, filed on Apr. 11, 2003, now abandoned, and a continuation-in-part of application No. 10/408,631, filed on Apr. 7, 2003, now abandoned, and a continuation-in-part of application No. 10/196,814, filed on Jul. 17, 2002, now abandoned.

(30) Foreign Application Priority Data

Jun. 27, 2003 (KR) .................. 10-2003-0042844

(51) Int. Cl.
*H01L 21/44* (2006.01)

(52) U.S. Cl. .................. 438/681; 438/680; 438/685; 438/653; 438/656

(58) Field of Classification Search ............... 438/216, 438/287, 591, 592, 183, 685, 680, 653, 656, 438/681; 257/E23.163, E21.463, E21.168, 257/E21.295
See application file for complete search history.

(56) References Cited

U.S. PATENT DOCUMENTS

| | | | |
|---|---|---|---|
| 5,316,982 A | | 5/1994 | Taniguchi |
| 5,668,021 A | * | 9/1997 | Subramanian et al. ...... 438/282 |
| 5,668,054 A | | 9/1997 | Sun et al. |
| 6,153,519 A | | 11/2000 | Jain et al. |
| 6,168,991 B1 | | 1/2001 | Choi et al. |
| 6,203,613 B1 | | 3/2001 | Gates et al. |
| 6,204,204 B1 | | 3/2001 | Paranjpe et al. |
| 6,221,712 B1 | * | 4/2001 | Huang et al. ............... 438/240 |
| 6,357,901 B1 | | 3/2002 | Grossman et al. |
| 6,368,923 B1 | * | 4/2002 | Huang .................. 438/275 |
| 6,492,217 B1 | | 12/2002 | Bai et al. |

(Continued)

FOREIGN PATENT DOCUMENTS

JP 2002193981 A 8/2002

(Continued)

*Primary Examiner*—George Fourson
*Assistant Examiner*—Julio Maldonado

(57) ABSTRACT

In a method for forming a gate electrode, a dielectric layer having a high dielectric constant is formed on a substrate. Tantalum amine derivatives represented by a chemical formula $Ta(NR_1)(NR_2R_3)_3$ in which $R_1$, $R_2$ and $R_3$ represent H or $C_1$–$C_6$ alkyl group are introduced onto the dielectric layer to form a tantalum nitride layer. A capacitor metal layer or a gate metal layer is formed on the tantalum nitride layer. The capacitor metal layer or the gate metal layer and the tantalum nitride layer are patterned to form a capacitor electrode or a gate electrode. The tantalum amine derivatives are used in forming a dual gate electrode.

19 Claims, 23 Drawing Sheets

U.S. PATENT DOCUMENTS

| | | |
|---|---|---|
| 6,504,214 B1 | 1/2003 | Yu et al. |
| 6,537,901 B1 | 3/2003 | Cha et al. |
| 6,607,958 B1 * | 8/2003 | Suguro ................ 438/287 |
| 6,727,148 B1 * | 4/2004 | Setton ................ 438/287 |
| 2002/0104481 A1 * | 8/2002 | Chiang et al. ............ 118/723 I |
| 2002/0144657 A1 * | 10/2002 | Chiang et al. ............ 118/723 E |

FOREIGN PATENT DOCUMENTS

| | | |
|---|---|---|
| KR | 1020030009093 A | 1/2003 |

* cited by examiner

US 7,081,409 B2

METHODS OF PRODUCING INTEGRATED CIRCUIT DEVICES UTILIZING TANTALUM AMINE DERIVATIVES

CROSS REFERENCE TO RELATED APPLICATIONS

This application is a Continuation-In-Part of U.S. patent application Ser. No. 10/196,814, filed on Jul. 17, 2002 now abandoned; U.S. patent application Ser. No. 10/408,631, filed on Apr. 7, 2003 now abandoned; U.S. patent application Ser. No. 10/411,949, filed on Apr. 11, 2003 now abandoned; and U.S. patent application Ser. No. 10/425,276, filed on Apr. 29, 2003, now U.S. Pat. No. 6,815,285, the contents of which are herein incorporated by reference in its entirety as if set forth fully herein. This application also claims priority under 35 USC § 119 to Korean Patent Application No. 2003-42844, filed on Jun. 27, 2003, the contents of which are herein incorporated by reference in its entirety as if set forth fully herein.

BACKGROUND OF THE INVENTION

1. Field of the Invention

The present invention relates to methods of forming an electrode for an integrated circuit device.

2. Description of the Related Art

A transistor of integrated circuit device may include a gate electrode formed on an active region of a substrate, a gate insulating layer interposed between the gate electrode and the substrate, and at least one source/drain regions formed on the active region positioned at both sides of the gate electrode. A metal oxide semiconductor field effect transistor (MOSFET) may be employed in integrated circuit devices. The MOSFET may include a gate insulating layer formed on a substrate and a gate electrode formed on the gate insulating layer. A MOS type highly-integrated integrated circuit device may include a complement-MOS (C-MOS) type device that has both an N-MOS transistor and a P-MOS transistor.

The C-MOS type integrated circuit device may include a single kind of a conductive material as gate electrodes of the N-MOS transistor and the P-MOS transistor to simplify processes for manufacturing the C-MOS type integrated circuit device. The conductive material used as gate electrodes may include N type poly crystalline silicon. A silicon oxide layer including a thermal oxide layer may be used as a gate insulating layer. The gate electrode may include a doped polysilicon layer.

As semiconductor devices provide higher operating speeds, a thickness of the gate insulating layer may be reduced. When the thickness of the gate insulating layer is reduced to less than a critical thickness, a leakage current may occur thereby degrading characteristics of the semiconductor device. Recently, thickness of layers used as the gate insulating have approached this critical thickness. Thus, further reduction in thickness of silicon oxide layers used as gate insulating layers may be limited. Therefore, use of high-k dielectrics as gate insulating layers have been studied.

High-k dielectrics may provide improved characteristics with respect to reducing leakage currents even when an equivalent oxide thickness (EOT) is less than a critical thickness of a silicon oxide layer. The EOT of a high-k dielectrics layer means the thickness of a silicon oxide layer that would provide the same capacitance. Thus, use of a high-k dielectrics can provide a capacitance equivalent to that provided using a physically thinner silicon oxide layer while providing improved leakage current characteristics.

On the other hand, when a high-k dielectric is used as a gate insulating layer, the high-k dielectric may react with n-type polycrystalline used as the gate electrode to form a silicon oxide layer. As a result, the silicon oxide layer formed through the reaction may increase a total EOT of the gate insulating. In addition, a work function of the materials of the gate electrode may have an effect on electrical characteristics of the transistor.

FIGS. 1A to 1C are cross sectional views illustrating conventional art views depicting methods for forming a dual gate electrode. FIG. 1A illustrates an isolation layer 2 formed on a substrate 1. Impurities are illustrated doped into the substrate 1 to form a P type active region 3 and an N type active region 4. An N-MOS gate insulating layer 5 may then formed on the substrate 1. A P-MOS gate electrode layer 6 can then be formed on the N-MOS gate insulating layer 5 and the isolation layer 2.

FIG. 1B illustrates that the N-MOS gate electrode layer 6 and the N-MOS gate insulating layer 5 are etched to form an N-MOS gate electrode 6a disposed on the P type active region 3. A P-MOS gate insulating layer 7 is formed on the N-MOS gate electrode 6a and the substrate 1. A P-MOS gate electrode layer 8 is formed on the N-MOS gate electrode 6a and the isolation layer 2. Here, the work function of the P-MOS gate electrode 8 is greater than that of the N-MOS gate electrode 6a.

FIG. 1C depicts that the P-MOS gate electrode layer and the P-MOS gate insulating layer are etched to form a P-MOS gate electrode 8a disposed on the N type active region 4. It is possible for the N-MOS gate electrode 6a to be damaged during the etching process of the P-MOS gate electrode 8 and the P-MOS gate insulating layer 7 to deteriorate an N-MOS transistor having the N-MOS gate electrode 6a during this process. Furthermore, the method for manufacturing the N-MOS gate electrode 6a and the P-MOS gate electrode 8a using a damascene process may cause additional damage to the electrodes.

An electrode of an integrated circuit device may include an electrode for a capacitor. A dynamic random access memory (DRAM) device may include a single access transistor and a single storage capacitor. The size of the capacitor can be reduced to increase the integration degree of a memory device.

The methods for improving capacitance may include methods for forming a dielectric layer using a high dielectric constant, a method for increasing the effective area of a capacitor or a method for reducing the thickness of a dielectric layer. Metal oxide material having a high dielectric constant, such as tantalum oxide ($Ta_2O_5$), titanium oxide ($TiO_2$), aluminum oxide ($Al_2O_3$), yttrium oxide ($Y_2O_3$), zirconium oxide ($ZrO_2$), hafnium oxide ($HfO_2$), barium titanium oxide ($BaTiO_3$) or strontium titanium oxide ($SrTiO_3$), may be used as the dielectric layer. U.S. Pat. No. 5,316,982, issued to Taniguchi illustrates a capacitor having a dielectric layer that includes metal oxide material. When the dielectric layer is formed using metal oxide material of the '982 patent, the metal oxide material may be readily reacted with an electrode layer of a capacitor. Oxygen contained in a metal oxide material may be readily reacted with silicon and may cause the deterioration of the characteristics of the capacitor. This, in turn, may result in a reduction in the reliability of an integrated circuit.

Materials used for an electrode that may be matched with the metal oxide material used for a dielectric layer may assist in reducing deterioration of the characteristics of the capacitor. U.S. Pat. No. 6,204,204 issued to Paranjpe et al., U.S. Pat. No. 6,153,519 issued to Jain et al., and U.S. Pat. No. 5,668,054 issued to Sun et al., illustrate method for forming a tantalum nitride layer as a thin metal layer. In a method disclosed in the U.S. Pat. No. 5,668,054, a tantalum nitride layer is formed through a chemical vapor deposition (CVD) process using terbutylimido-tris-diethylamino-tantalum ((Net$_2$)$_3$Ta=NtBu) (TBTDET) as a reactant. The CVD process is performed at a temperature of above about 600° C. When the CVD process is performed at a temperature of about 500° C., the tantalum nitride layer has a specific resistance of above about 10,000 Ωcm.

Other processes may be used to deposit the tantalum nitride layer. U.S. Pat. No. 6,203,613 issued to Gates et al. shows methods for forming tantalum nitride layer using an atomic layer deposition (ALD) process.

U.S. Pat. No. 6,357,901 issued to Cha et al. discloses method for forming a transistor of an integrated circuit device. In the '901 patent, an insulating layer is formed on a substrate defined N-MOS region and P-MOS region thereon. A tantalum layer or a tantalum nitride layer having a work function of about 4.0 eV to about 4.4 eV is formed on the gate insulating layer positioned on the N-MOS region. A tantalum layer or a tantalum nitride layer having a work function of about 4.8 eV to about 5.2 eV is formed on the gate insulating layer positioned on the P-MOS region. A metal layer having a low resistance such as tungsten is formed on the tantalum layers or the tantalum nitride layers. Here, TaCl, Ta(OCH), tetrakis dimethylamido titanium (TD-MAT) or tetrakis diethylamino titanium (TDEAT) is used as a precursor of tantalum.

U.S. Pat. No. 6,504,214 issued to Yu et al. discloses a method for manufacturing a MOSFET that includes a dielectric layer having a high dielectric constant. In the '214 patent, a gate insulating layer having a high dielectric constant is formed on a substrate having a buffer surface. A gate electrode including tungsten, tantalum, titanium nitride or tantalum nitride is formed on the gate insulating layer. A gate electrode contact including metal silicide or metal is formed on the gate electrode.

U.S. Pat. No. 6,492,217 issued to Bai et al. illustrates a method for forming a gate electrode. In the '217 patent, a gate dielectric layer is formed on a substrate. A barrier layer including titanium nitride, titanium silicon nitride or tantalum nitride is formed on the gate dielectric layer. A gate electrode is formed on the barrier layer.

U.S. Pat. No. 6,168,991 issued to Choi et al. depicts method for manufacturing a capacitor of a DRAM cell. In the '991 patent, a first electrode layer including tantalum, tantalum nitride or a multi-layer thereof is formed on a substrate. The first electrode layer serves as a first electrode and a barrier layer. A dielectric layer having a high dielectric constant is formed on the first electrode layer. A second electrode layer having a material substantially identical to that of the first electrode layer is formed on the dielectric layer.

Ritala et al. in "Controlled Growth of TaN, Ta$_3$N$_5$ and TaO$_x$N$_y$ Thin Films by Atomic Layer Deposition" illustrate the deposition of a thin tantalum nitride layer by an ALD method using TaCl$_5$ source. Tsai et al. in "Metal Organic Chemical Vapor Deposition of Tantalum Nitride by Terbutylimidotris (Diethylamido) Tantalum for advanced metallization" illustrate a CVD method using a TBTDET source.

Japanese Patent Laid Open Publication No. 2002-193981 illustrates a method for fabricating Ta(NC(Ch$_3$)$_2$C$_2$H$_5$)(N(CH$_3$)$_2$)$_3$) (TAIMATA) and a metal organic chemical vapor deposition (MOCVD) method using a precursor solution including the same. According to the methods disclosed, 1 mole of TaCl$_5$, 4 moles of LiNMe$_2$ and 1 mole of LiNHtAm are reacted with each other in an organic solution at a room temperature to form a compound. The compound is filtered. The organic solution is removed from the filtered compound to form Ta(NC(Ch$_3$)$_2$C$_2$H$_5$)(N(CH$_3$)$_2$)$_3$). Ta(NC(Ch$_3$)$_2$C$_2$H$_5$)(N(CH$_3$)$_2$)$_3$) is dissolved in a organic solution. Dissolved Ta(NC(Ch$_3$)$_2$C$_2$H$_5$)(N(CH$_3$)$_2$)$_3$) is deposited on a substrate disposed in a CVD chamber to form a tantalum nitride layer.

The Japanese Patent Laid Open Publication discloses that the tantalum nitride layer is formed using only Ta(NC(Ch$_3$)$_2$C$_2$H$_5$)(N(CH$_3$)$_2$)$_3$). Korean Patent Laid Open Publication No. 2003-9093 discloses a method for forming an atomic layer and a thin film using an organic metal precursor or a tantalum halide precursor. According to the disclosed method, a gaseous reactant is introduced into a chamber in which a substrate is disposed. The gaseous reactant is deposited on the substrate by atomic layer units.

SUMMARY OF THE INVENTION

In a method for forming a gate electrode in accordance with one aspect of the present invention, a dielectric layer having a high dielectric constant is formed on a substrate. Tantalum amine derivatives represented by a chemical formula Ta(NR$_1$)(NR$_2$R$_3$)$_3$ wherein R$_1$, R$_2$ and R$_3$ represent H or C$_1$–C$_6$ alkyl group are introduced onto the dielectric layer to form a metal barrier layer. A gate metal layer is formed on the metal barrier layer. The gate metal layer and the metal barrier layer are patterned to form a gate metal pattern and a metal barrier pattern. The tantalum amine derivative may introduced into at a temperature of about 100° C. to about 650° C. The metal layer may be deposited by a chemical vapor deposition (CVD) process, a plasma enhanced CVD (PECVD) process, an atomic layer deposition (ALD) process, and a radical assisted ALD (RAALD) process. The dielectric layer may include tantalum oxide (Ta$_2$O$_5$), titanium oxide (TiO$_2$), hafnium oxide (HfO$_2$), zirconium oxide (ZrO$_2$), aluminum oxide (Al$_2$O$_3$), yttrium oxide (Y$_2$O$_3$), niobium oxide (Nb$_2$O$_5$), cesium oxide (CeO$_2$), indium oxide (InO$_3$), iridium oxide (IrO$_2$), lanthanum oxide (LaO2), barium strontium titanium (BST) or lead zirconium titanate (PZT). The gate metal layer may include tungsten, tantalum, titanium, aluminum, copper, titanium silicide, cobalt silicide, nickel silicide, tungsten silicide, tantalum nitride and/or titanium nitride. An upper face of the substrate may be exposed to form a mold pattern on the substrate before forming the dielectric layer. The upper face of the substrate corresponds to a position on which the metal barrier layer is formed. The metal layer, the metal barrier layer and the dielectric layer may be etched to expose an upper face of the mold pattern to form the gate metal pattern, the metal barrier pattern and a dielectric layer pattern disposed in the exposed face. The mold pattern may be then removed.

In a method for forming a gate electrode in accordance with another aspect of the present invention, a dielectric layer having a high dielectric constant is formed on a substrate. Tantalum amine derivatives represented by a chemical formula Ta(NR$_1$)(NR$_2$R$_3$)$_3$ wherein R$_1$, R$_2$ and R$_3$ represent H or C$_1$–C$_6$ alkyl group are introduced onto the dielectric layer to form a gate metal layer. The gate metal layer is patterned to form a gate metal pattern. The tantalum amine derivative may include Ta(NC(Ch$_3$)$_2$C$_2$H$_5$)(N(CH$_3$)$_2$)$_3$). The dielectric layer may include the materials as noted above. Additionally, the substrate having the dielectric layer may be thermally treated before forming the gate metal layer.

In a method for forming a dual gate electrode in accordance with still another aspect of the present invention, a gate insulating layer is formed on a substrate having an N-MOS transistor region and P-MOS transistor region. Tantalum amine derivatives represented by a chemical formula $Ta(NR_1)(NR_2R_3)_3$ wherein $R_1$, $R_2$ and $R_3$ represent H or $C_1$–$C_6$ alkyl group is introduced onto the gate insulating layer to form a first metal nitride layer. Nitrogen ions are selectively implanted into the first metal nitride layer positioned in the P-MOS transistor region to form a second metal nitride layer having rich nitrogen. The first and second metal nitride layers are patterned to form an N-MOS gate electrode in the N-MOS transistor region and a P-MOS gate electrode in the P-MOS transistor region. The second metal nitride layer may have a work function higher than that of the first metal nitride layer. The dielectric layer may include tantalum oxide ($Ta_2O_5$), titanium oxide ($TiO_2$), hafnium oxide ($HfO_2$), zirconium oxide ($ZrO_2$), aluminum oxide ($Al_2O_3$), yttrium oxide ($Y_2O_3$), niobium oxide ($Nb_2O_5$), cesium oxide ($CeO_2$), indium oxide ($InO_3$), iridium oxide ($IrO_2$), lanthanum oxide ($LaO_2$), barium strontium titanium (BST) or lead zirconium titanate (PZT). A silicate layer may be formed on the substrate before forming the gate insulating layer. Additionally, the first metal nitride layer may be post-treated and activated by remote plasma or direct plasma. The substrate into which the nitrogen ions are implanted may be annealed. Further, a conductive layer, which has a specific resistance lower than that of the first and second metal nitride layers, may be formed on the first and second metal nitride layers.

In a method for forming a dual gate electrode in accordance with still another aspect of the present invention a mold insulating layer is formed on a substrate having an N-MOS transistor region and P-MOS transistor region. The mold insulating layer is etched to form an N-MOS gate opening exposing the N-MOS transistor region and a P-MOS gate opening exposing the P-MOS transistor region. A gate insulating layer is formed on the mold insulating layer, and a side face and a bottom face of the N-MOS and P-MOS gate openings. Tantalum amine derivatives represented by a chemical formula $Ta(NR_1)(NR_2R_3)_3$ wherein $R_1$, $R_2$ and $R_3$ represent H or $C_1$—$C_6$ alkyl group is introduced onto the gate insulating layer to form a metal nitride layer filling the N-MOS and P-MOS gate openings. The metal nitride layer is planarized to form an N-MOS gate electrode in the N-MOS gate opening and a preliminary P-MOS gate electrode in the P-MOS gate opening. Nitrogen ions are selectively implanted into the preliminary P-MOS gate electrode to form a P-MOS gate electrode. A conformal silicate layer may be formed on the substrate before forming the gate insulating layer. Additionally, the first metal nitride layer may be post-treated by remote plasma or direct plasma. The substrate having the P-MOS gate electrode may be annealed. The gate insulating layer and the mold insulating layer may be isotropically etched after forming the P-MOS gate electrode.

In a method for forming a capacitor in accordance with still another aspect of the present invention, tantalum amine derivatives represented by a chemical formula $Ta(NR_1)(NR_2R_3)_3$ wherein $R_1$, $R_2$ and $R_3$ represent H or $C_1$–$C_6$ alkyl group is introduced onto a substrate to form a first electrode. A dielectric layer is formed on the first electrode. A second electrode is formed on the dielectric layer. The tantalum amine derivatives may be introduced by a liquid delivery system (LDS) or a bubbler. Additionally, the first electrode may be post-treated by activating a material by remote plasma or a direct plasma.

In a method for forming a capacitor in accordance with still another aspect of the present invention, a first electrode is formed on a substrate. A dielectric layer is formed on the first electrode. Tantalum amine derivatives represented by a chemical formula $Ta(NR_1)(NR_2R_3)_3$ wherein $R_1$, $R_2$ and $R_3$ represent H or $C_1$–$C_6$ alkyl group is introduced onto the dielectric layer to form a second electrode. Additionally, a capping layer including tantalum nitride may be formed on the second electrode.

DESCRIPTION OF THE PREFERRED EMBODIMENTS

The foregoing and other aspects of the present invention will now be described in more detail with respect to the embodiments described herein. It should be appreciated that the invention may be embodied in different forms and should not be construed as limited to the embodiments set forth herein. Rather, these embodiments are provided so that this disclosure will be thorough and complete, and will fully convey the scope of the invention to those skilled in the art. It will be understood that when an element such as a layer, a region or an integrated circuit device is referred to as being "on" another element, it can be directly on the other element or intervening elements may also be present. It will be understood that if part of an element, such as a surface of a conductive line, is referred to as "outer", it is closer to the outside of the integrated circuit than other parts of the element. Furthermore, relative terms such as "beneath" may be used herein to describe a relationship of one layer or region to another layer or region relative to an integrated circuit device or a base layer as illustrated in the figures. It will be understood that these terms are intended to encompass different orientations of the device in addition to the orientation depicted in the figures. Finally, the term "directly" means that there are no intervening elements.

Hereinafter, methods for forming an electrode in accordance with the present invention are illustrated in detail.

FIGS. 2A to 2D are cross sectional views illustrating methods for forming a gate electrode in accordance with some embodiments of the present invention.

Figure 1A:
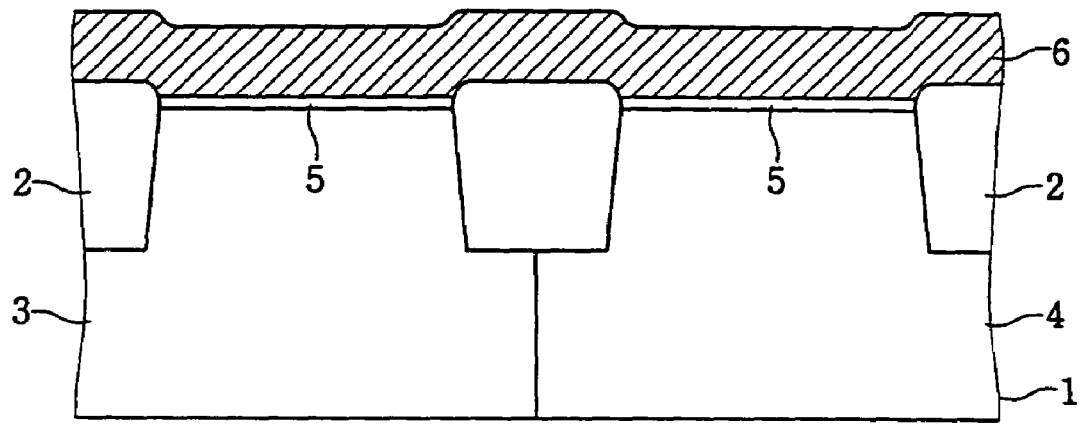
FIGS. 1A to 1C are cross sectional views illustrating a conventional method for forming a dual gate electrode.
Figure 1B:
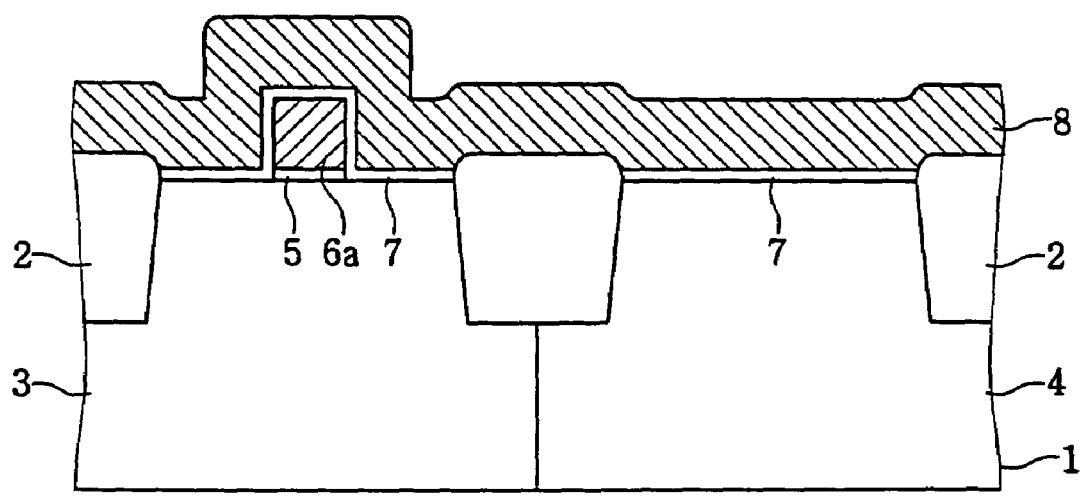
Figure 1C:
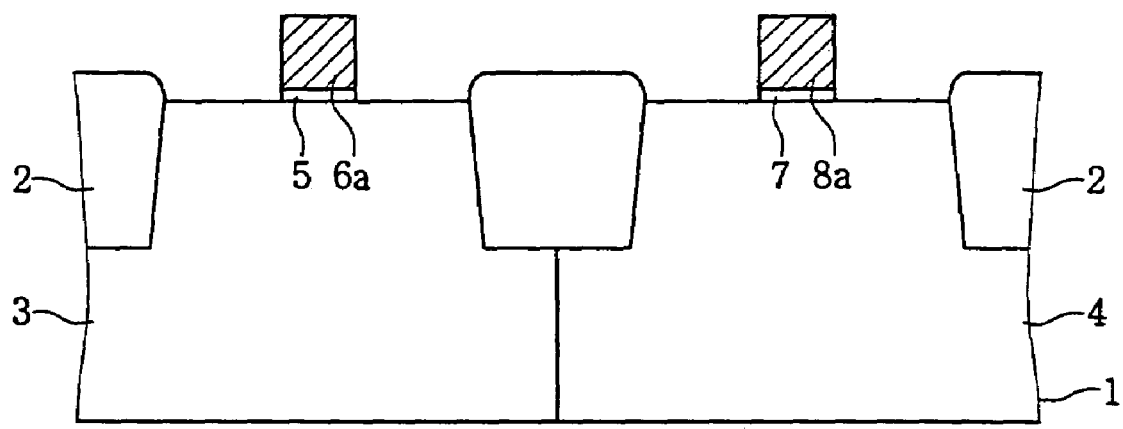
Figure 2A:
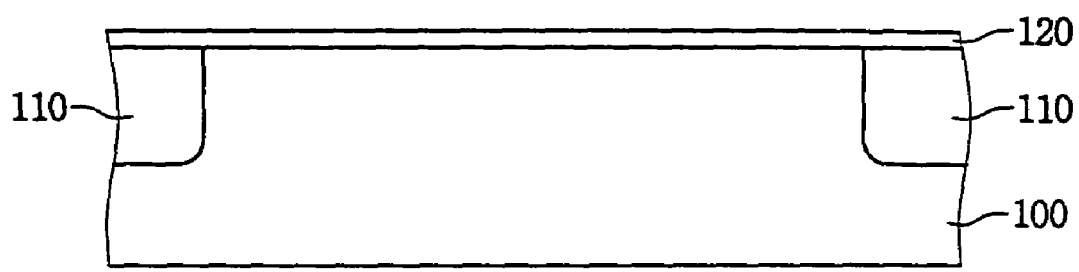
FIGS. 2A to 2D are cross sectional views illustrating methods for forming a gate electrode in accordance with some embodiments of the present invention.

Referring to FIG. 2A, an isolation layer 110 is formed on a substrate 100 to define an active region on the substrate 100. A dielectric layer 120 having a high dielectric constant is formed on the isolation layer 110 and the substrate 100.

The isolation layer 110 may be formed by a trench isolation process to isolate the active region. A thermal oxide layer (not shown) and a silicon nitride liner (not shown) may be formed between the isolation layer 110 and the substrate 100.

The dielectric layer 120 having a high dielectric constant serves as a gate insulating layer of a MOS transistor. The dielectric layer 120 having a high dielectric constant may preferably include a tantalum oxide layer ($Ta_2O_5$), a titanium oxide layer ($TiO_2$), a hafnium oxide layer ($HfO_2$), a zirconium oxide layer ($ZrO_2$), an aluminum oxide layer ($Al_2O_3$), an yttrium oxide layer ($Y_2O_3$), a niobium oxide layer ($Nb_2O_5$), a cesium oxide layer ($CeO_2$), an indium oxide layer ($InO_3$), an iridium oxide layer ($IrO_2$), $SrTiO_3$, $PbTiO_3$, $SrRuO_3$, $CaRuO_3$, $(Ba, Sr)TiO_3$, $Pb(Zr, Ti)O_3$, $(Pb, La)(Zr, Ti)O_3$ or $(Sr, Ca)RuO_3$. Alternatively, the dielectric layer 120 having a high dielectric constant may have a laminate structure that includes at least two stacked layers among the above layers used as the dielectric layer 120. The dielectric layer 120 having a high dielectric constant may be formed by a CVD process, an ALD process or a metal organic CVD (MOCVD) process.

The high dielectric constant of the dielectric layer 120 is created from a strong ionic polarization. To have a high dielectric constant, the dielectric layer 120 may meet three conditions that include being free of impurities, correct stoichiometry and proper crystalline formation. The dielectric layer 120 may be formed by the MOCVD process at a low temperature of about 400° C. to about 500° C. to have excellent step coverage. The dielectric layer 120 formed at the low temperature may not meet the three conditions to be free from impurities. Thus, the dielectric layer 120 may be thermally treated to have a high capacitance and a low leakage current.

One example of a thermal treating process follows. A thermal treating process may remove impurities in the deposited layer. For example, a thermal treating process may be performed on a tantalum oxide layer at a temperature of about 600° C. to discharge a $CH_4$ gas and a $H_2O$ gas from the tantalum oxide layer. Similarly, the thermal treating process may be performed on the BST layer at a temperature of about 900° C. to discharge a $CO_2$ gas dissociated from metal carbonate impurities in the BST layer. The discharges of the gases may be verified using a thermal desorption spectroscopy. The impurities of the deposited layer may be removed to increase the density of the deposited layer. This may allow for the thermally treated layer to have a high capacitance and a low leakage current.

The thermal treating process may also be utilized to provide the correct stoichiometry to the deposited layer. One example of such a process includes when the deposited tantalum oxide layer is short of oxygen, the deposited tantalum oxide layer is thermally treated under oxygen atmosphere to have the correct stoichiometry.

The thermal treating process may also crystallize the dielectric layer 120. The layer deposited at a low temperature is in amorphous state. Thus, the deposited layer does not have a microstructure necessary for desirable electric characteristics. The thermal treating temperature required for crystallizing the tantalum oxide layer is about 800° C. The thermal treating temperature required for crystallizing the BST layer is about 700° C.

When the time for thermally treating the dielectric layer 120 is too long, oxygen atoms pass through the dielectric layer 120. The oxygen atoms may be reacted with a surface of the substrate 100 to form a silicon oxide layer (not shown) interposed between the dielectric layer 120 and the substrate 100. The silicon oxide layer decreases the capacitance of the gate insulating layer. Accordingly, it may be beneficial to carefully control the thermal treating process. The thermal treating process may include a rapid thermal process (RTP) to prevent the formation of the silicon oxide layer.

Figure 2B:
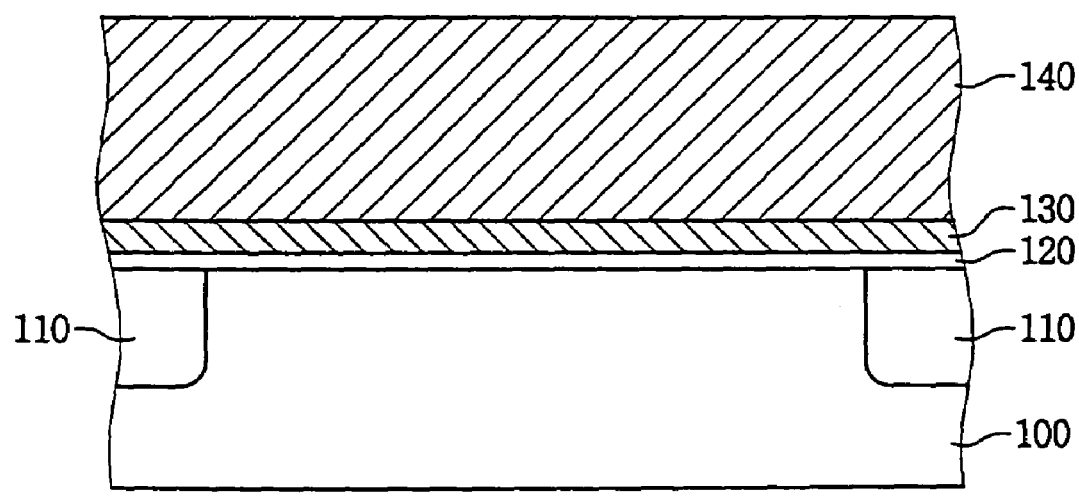

Referring to FIG. 2B, a metal barrier layer 130 is formed on the dielectric layer 120. A gate metal layer 140 is formed on the metal barrier layer 130. The metal barrier layer 130 includes a conductive material that is not reacted with the dielectric layer 120. The metal barrier layer 130 may include a conductive layer having an excellent oxidation resistance to prevent oxidizing reaction, which induced the increase of the EOT, between metal barrier layer 130 and the dielectric layer 120.

The metal barrier layer 130 may be formed by a CVD process, a PECVD process, an ALD process or a RAALD process. When the metal barrier layer 130 is a tantalum nitride layer, the process for forming the metal barrier layer 130 is performed using a reacting gas including $H_2$, $N_2$, $NH_3$, $SiH_4$, $Si_2H_6$ or mixtures thereof and a precursor including $Ta(NC(CH_3)_2C_2H_5)(N(CH_3)_2)_3)$ at a temperature of about 100° C. to about 650° C. under a pressure of about 0.01 Torr to about 30 Torr. Here, the metal barrier layer 130 may have an etching selectivity relative to the dielectric layer 120.

Although the metal barrier layer 130 is the conductive layer, the metal barrier layer 130 is inappropriate for using as a gate electrode due to the requirement of a rapidly operable semiconductor device. When a metal organic precursor is used for forming the metal barrier layer 130, the quantity of carbon contained in the metal barrier layer increases. The carbon increases the specific resistance of the gate electrode. Thus, it may be beneficial to reduce the specific resistance of the gate electrode for manufacturing the rapidly operable semiconductor device. One reduction may include the gate metal layer 140 including a metal that has a low specific resistance. The gate metal layer 140 may include tungsten, tantalum, titanium, aluminum, copper, titanium silicide or cobalt silicide. The gate metal layer may be formed by a PVD process, a CVD process or a silicidation process.

Figure 2C:
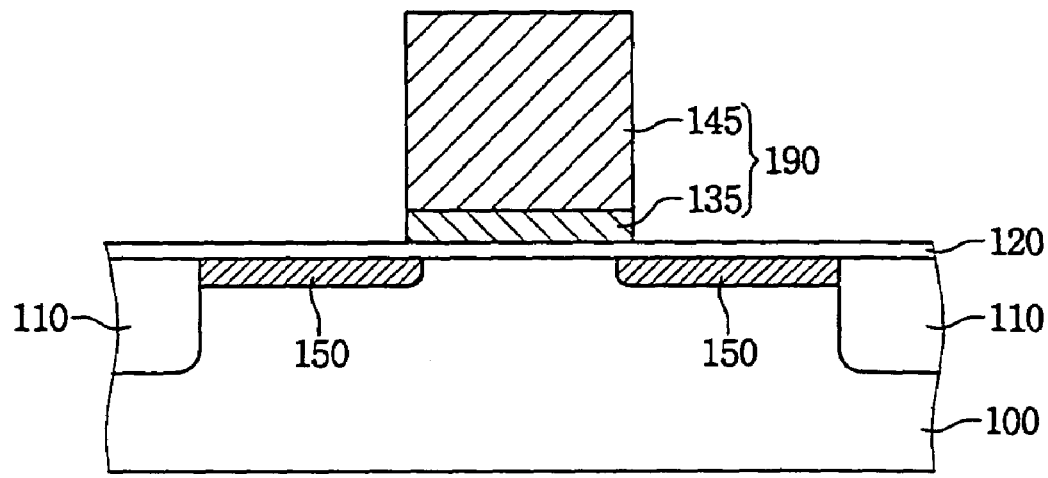

Referring to FIG. 2C, the gate metal layer 140 and the metal barrier layer 130 are etched to form a gate pattern 190 including a metal barrier pattern 135 and a gate metal pattern 145 formed on the metal barrier pattern 135. The gate pattern 190 traverses between the isolation layers 110. The dielectric layer 120 is not covered by the gate pattern 190 to have an exposed surface.

The etching process for forming the gate pattern 190 may include an anisotropic etching process using a photoresist pattern as an etching mask. The dielectric layer 120 positioned around the gate pattern 190 may serve as a buffer layer for preventing an ion channeling during a successive ion implanting process for forming a low-concentrated impurity region. The substrate 100 positioned around the gate pattern 190 is source/drain regions formed by the ion implanting process. The etching process may be preferably carried out in the manner to minimize the damages of the dielectric layer 120 and the substrate 100. The etching process for forming the gate pattern 190 is performed using an etchant that has an etching selectivity relative to the dielectric layer 120.

Impurities are implanted into the substrate 100 using the gate pattern 190 as an ion implanting mask to form the impurity region 150 having a low impurity concentration in the substrate 100 around the gate pattern 190.

Figure 2D:
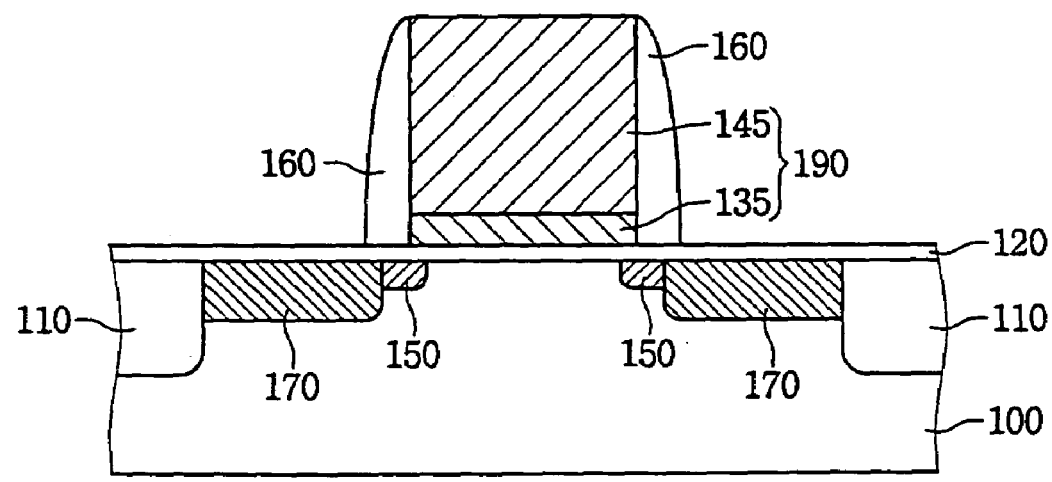

Referring to FIG. 2D, a gate spacer 160 is formed on a sidewall of the gate pattern 190. Impurities are implanted into the substrate 100 using the gate spacer 160 as an ion implanting mask to form the impurity region 170 having a high impurity concentration in the substrate 100 around the gate pattern 190.

A spacer insulating layer (not shown) is formed on the dielectric layer 120 and the gate pattern 190. The spacer insulating layer is anisotropically etched to form the gate spacer 160. The anisotropic etching process may be performed using an etchant that has an etching selectivity relative to the dielectric layer 120. Additionally, the substrate 100 may be thermally treated to activate the impurities implanted into the impurity regions 150 and 170. The thermal treating process may include a RTP.

Figure 4:
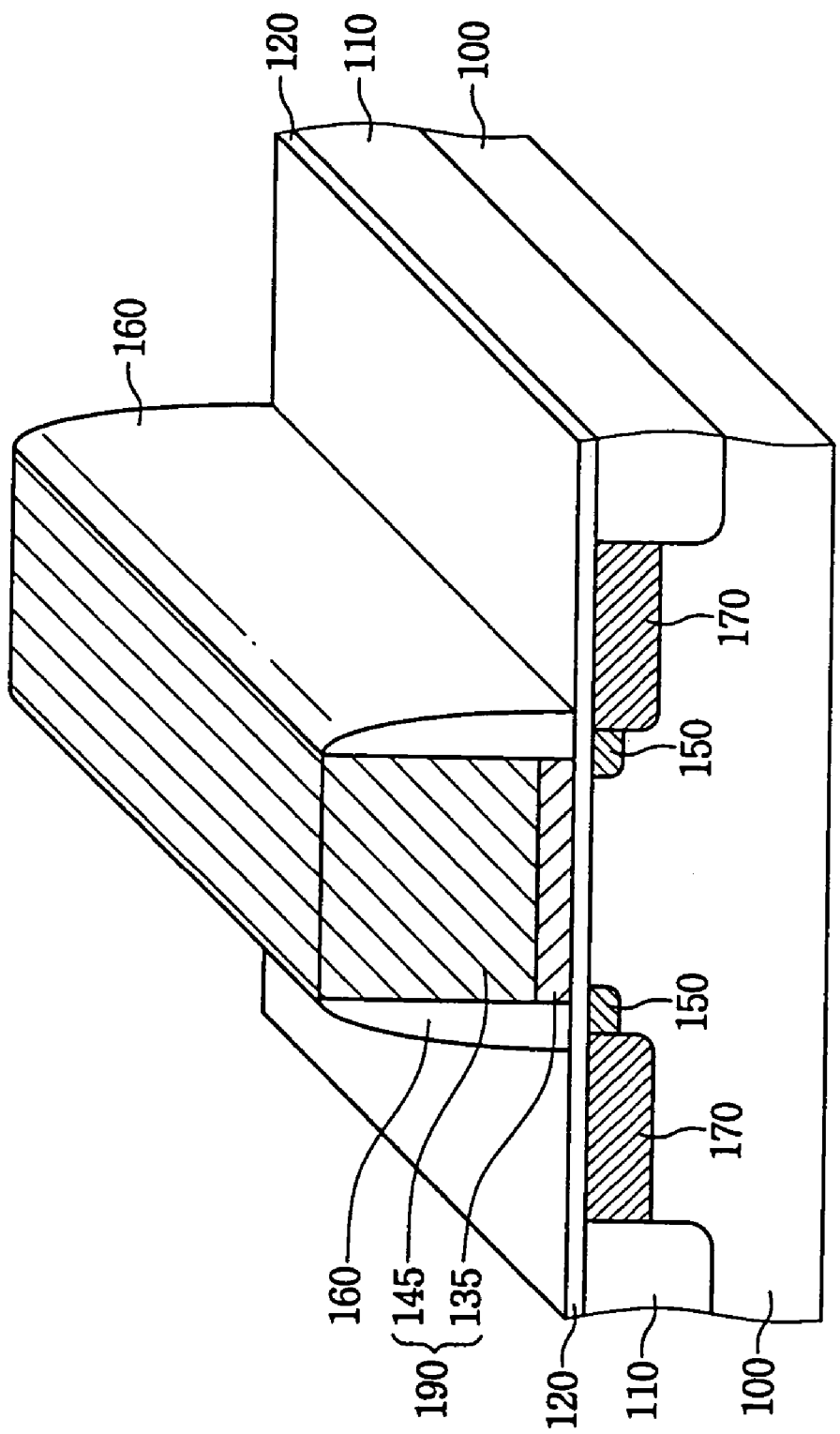
FIG. 4 is a perspective view illustrating a gate electrode formed in accordance with FIGS. 2A to 2D according to some embodiments of the present invention.

FIG. 4 is a perspective view illustrating a gate electrode formed in accordance with the first embodiment of the present invention.

Referring to FIG. 4, the isolation layer 110 defining the active region is disposed in the substrate 100. The gate pattern 190 traversing between the isolation layers 110 is disposed on the active region. The gate spacer 160 is disposed on the sidewall of the gate pattern 190. The gate pattern 190 includes the metal barrier pattern 135 and the gate metal pattern 145.

The impurity region 150 having a low impurity concentration is disposed in the substrate 100 around the gate pattern 190. The impurity region 170 having a high impurity concentration is disposed in the substrate 100 around the gate spacer 160. The impurity regions 150 and 170 may include an impurity having a substantially identical conductive type that is opposite to that of the substrate 100. The impurity region 170 having a high impurity concentration has a concentration higher and a depth deeper than those of the impurity region 150 having a low impurity concentration, respectively. Thus, the impurity regions 150 and 170 have a typical LDD structure, thereby serving as the source/drain of the transistor.

The dielectric layer 120 having a high dielectric constant is interposed between the gate spacer 160 and the substrate 100. The dielectric layer 120 serves as the gate insulating layer of the MOS transistor. Additionally, the dielectric layer 120 may be extended over the active region.

The dielectric layer 120 having a high dielectric constant may preferably include a tantalum oxide layer ($Ta_2O_5$), a titanium oxide layer ($TiO_2$), a hafnium oxide layer ($HfO_2$), a zirconium oxide layer ($ZrO_2$), an aluminum oxide layer ($Al_2O_3$), an yttrium oxide layer ($Y_2O_3$), a niobium oxide layer ($Nb_2O_5$), a cesium oxide layer ($CeO_2$), an indium oxide layer ($InO_3$), an iridium oxide layer ($IrO_2$), $SrTiO_3$, $PbTiO_3$, $SrRuO_3$, $CaRuO_3$, (Ba, Sr)$TiO_3$, Pb(Zr, Ti)$O_3$, (Pb, La)(Zr, Ti)$O_3$ or (Sr, Ca)$RuO_3$. Alternatively, the dielectric layer 120 having a high dielectric constant may have a laminate structure that includes at least two stacked layers among the above layers used as the dielectric layer 120.

The metal barrier pattern 135 prevents reaction between the dielectric layer 120 and the gate metal layer 140 or the dielectric layer pattern 125 and the gate metal pattern 145. Accordingly, the metal barrier pattern 135 includes a material reactivity-resistant relative to the dielectric layer 120 and the dielectric layer pattern 125. The material may include tantalum nitride, tungsten nitride or titanium nitride. Additionally, the metal barrier layer 135 preferably includes the tantalum nitride layer that has a work function of about 4.2 eV to about 5.5 eV.

The gate metal pattern 145 includes metal having a low specific resistance. Thus, the gate metal pattern 145 may include tungsten, tantalum, titanium, aluminum, copper, titanium silicide or cobalt silicide. According to the conventional method, the gate metal layer is reacted with the dielectric layer to form a metal oxide layer. However, according to the method of the present invention, the metal barrier layer 130 prevents the formation of the metal oxide layer.

Alternatively, the gate metal layer may be directly formed on the dielectric layer without the formation of the metal barrier layer to form the gate electrode. Here, when the tantalum amine derivatives represented by a chemical formula $Ta(NR_1)(NR_2R_3)_3$ wherein $R_1$, $R_2$ and $R_3$ represent H or $C_1$–$C_6$ alkyl group is used in the alternative method, the alternative method may be possibly employed in forming the gate electrode.

The tantalum amine derivatives includes Ta(NC($CH_3$)$_2C_2H_5$)(N($CH_3$)$_2$)$_3$). The tantalum amine derivatives may be deposited by a CVD process, a PECVD process, an ALD process or a RAALD process. The reacting gas including $H_2$, $N_2$, $NH_3$, $SiH_4$ or $Si_2H_6$ may be preferably introduced with the tantalum amine derivatives at a temperature of about 100° C. to about 650° C. under a pressure of about 0.01 Torr to about 30 Torr. Additionally, the substrate 100 having the dielectric layer 120 may be thermally treated before forming the gate metal layer 140. The alternative method for forming the gate electrode without the metal barrier layer may be substantially similar to the methods for forming the gate electrode with the metal barrier layer, except the formation of the metal barrier layer.

When the gate electrode including tantalum nitride formed according to the alternative method has a high specific resistance, the processes for forming the gate electrode is simplified by omitting the process for forming the metal barrier layer. Further, the gate electrode is plasma-treated to reduce the specific resistance of the gate metal layer.

Figure 3A:
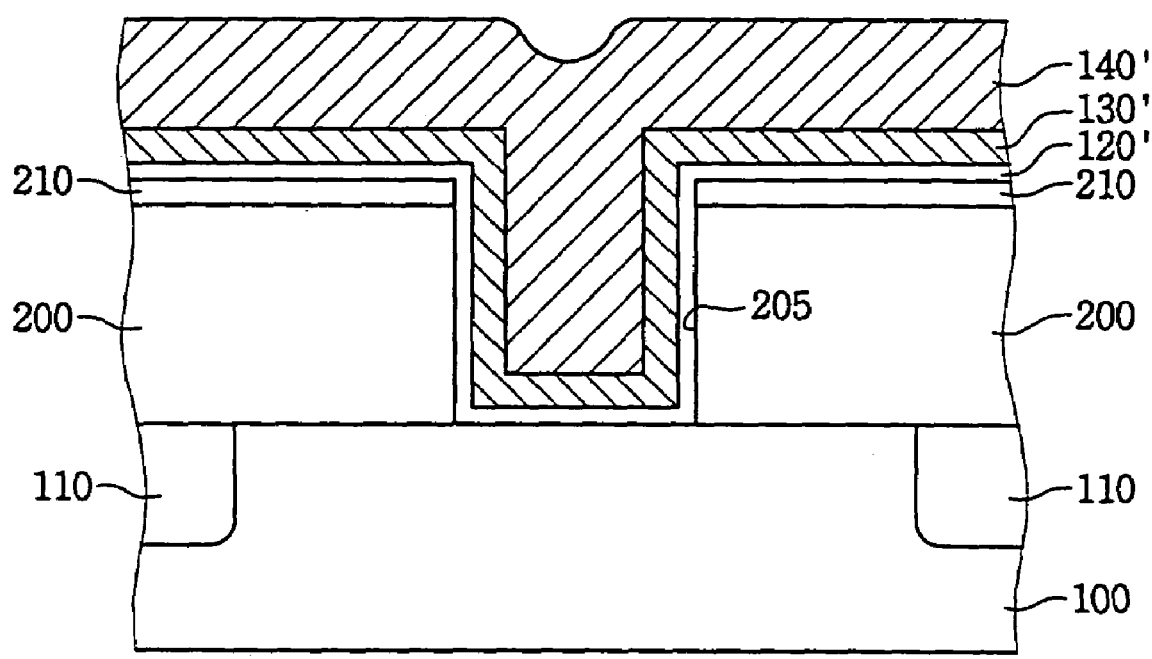
FIGS. 3A to 3C are cross sectional views illustrating methods for forming a gate electrode in accordance with some of the present invention.
Figure 3B:
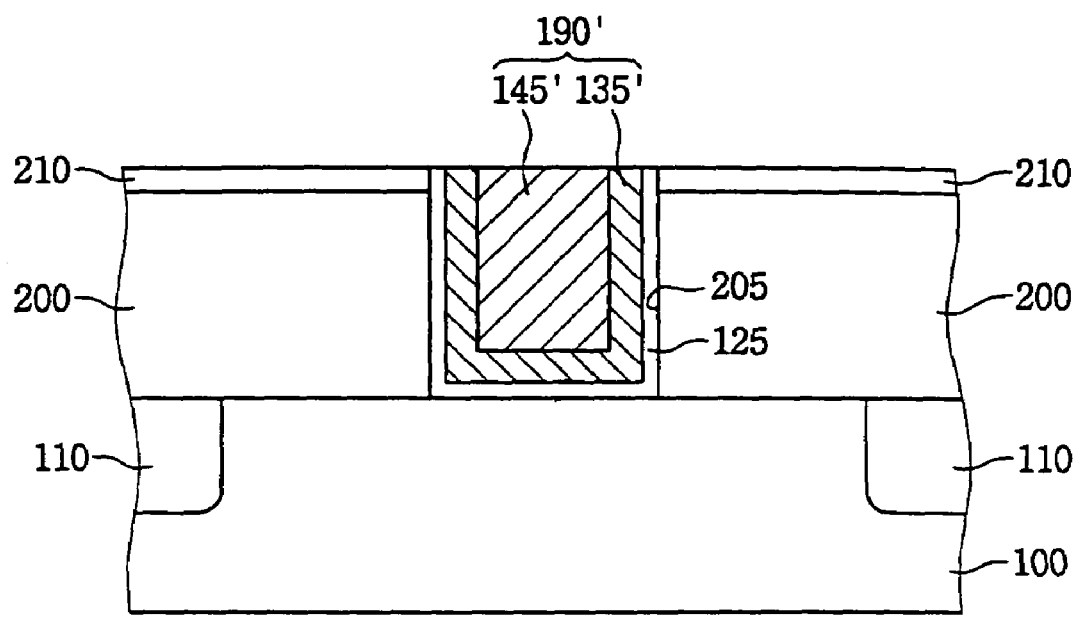
Figure 3C:
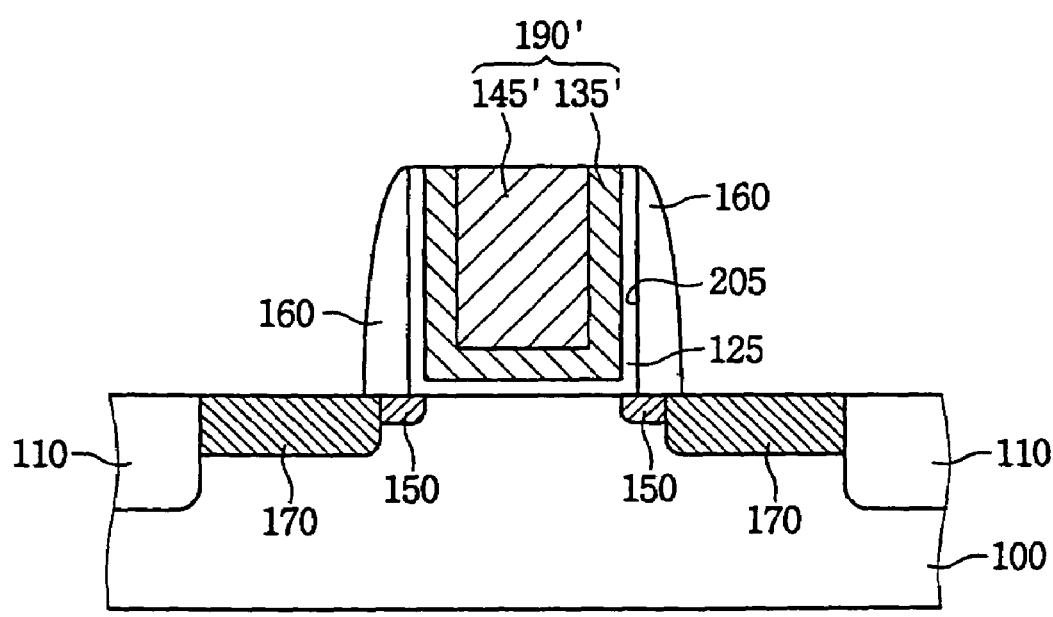

FIGS. 3A to 3C are cross sectional views illustrating a method for forming a gate electrode in accordance with some embodiments of the present invention. These embodiments may employ a damascene process. Substantially identical or similar layers are represented by same or similar numerals as in FIGS. 2A to 2D. The materials of layers and methods for forming the layers are substantially similar to those discussed above with respect to FIGS. 2A to 2D.

Referring to FIG. 3A, an isolation layer 110 is formed in a substrate 100 to define an active region on the substrate 100. A mold layer is formed on the isolation layer 110 and the substrate 100. The mold layer is patterned to form a mold pattern 200. The mold pattern 200 traverses between the isolation layers 110. The mold pattern 200 has also an opening 205 exposing an upper face of the substrate 100. When a gate pattern is formed by a damascene process, the mold pattern 200 serves as a cast defining the gate pattern. A dielectric layer 120' having a high dielectric constant is formed on the mold pattern 200, and a side face and a bottom face of the opening 205. A metal barrier layer 130' is formed on the dielectric layer 120'. A gate metal layer 140' is formed on the metal barrier layer 130'.

The patterning process for forming the mold pattern 200 may be performed by an anisotropic etching process using an etchant that has an etching selectivity relative to the substrate 100. Thus, the mold layer includes a material having an etching selectivity relative to the substrate 100. To minimize the damage of a gate pattern during a successive process for removing the mold pattern 200, the mold layer may include a material having an etching selectivity relative to the dielectric layer 120', the metal barrier layer 130' and the gate metal layer 140'. The mold layer may include silicon oxide, silicon nitride or silicon oxynitride. The dielectric layer 120' may be formed by an ALD process, a plasma enhanced ALD (PEALD) process, a CVD process or an RAALD process.

To form the mold pattern 200, a reflection preventing layer 210 may be further formed on the mold pattern 200. The reflection preventing layer 210 may preferably include silicon oxynitride. Thus, when the mold layer includes silicon oxynitride, it is not necessary to form the reflection preventing layer 210.

As a semiconductor device has been highly integrated, the gate pattern of the semiconductor device has a minute width. Thus, the opening 205 defining the gate pattern may have a high aspect ratio. Further, the opening 205 may have a higher aspect ratio due to the dielectric layer 120' and the metal barrier layer 130'.

When the metal barrier layer 130' has a poor step coverage, the inlet size of the opening 205 is reduced. The inlet of the opening 205 has a reduced area owing to the metal barrier layer 130' partially covering the inlet of the opening 204. Additionally, since the dielectric layer 120' is used as a gate insulating layer, the dielectric layer 120' is formed to have a uniform thickness. The dielectric layer 120' having a uniform thickness and the metal barrier layer 130' having improved step coverage may be formed by an ALD process or a PEALD process.

The gate metal layer 140' may include metal having a low specific resistance. The opening 205 has a high aspect ratio as describe above. Accordingly, the gate metal layer 140' may be formed by a deposition process having improved gap-filling characteristic. With a damascene process the gate metal layer 140' may include copper. The gate metal layer 140' may be formed by an electroplating process known in the art.

Referring to FIG. 3B, the gate metal layer 140', the metal barrier layer 130' and the dielectric layer 120' are planarized by a chemical mechanical polishing (CMP) process for exposing an upper face of the reflection preventing layer 210 to form a gate pattern 190' including a dielectric layer pattern 125, a metal barrier pattern 135' and a gate metal pattern 145' that fill the opening 205.

Viewing the gate pattern 190' in a cross sectional direction, the dielectric layer pattern 125 and the metal barrier pattern 135' has a U shape, and the gate metal pattern 145' has a rectangular shape. Here, the lower face of the dielectric layer pattern 125 serve as the gate insulating layer. Viewing the gate pattern 190' in a planar direction, the dielectric layer pattern 125, the metal barrier pattern 135' and the gate metal pattern 145' traverse between the isolation layers 110.

Referring to FIG. 3C, the reflection preventing layer 210 and the mold pattern 200 are removed to expose the substrate 100 around the gate pattern 190'. The removing process may be preferably carried out by an isotropic etching process using an etchant that has an etching selectivity relative to the dielectric layer pattern 125, the metal barrier pattern 135' and the gate metal pattern 145'.

Impurities are implanted into the substrate 100 using the gate pattern as an ion implanting mask to form a impurity region 150 having a low impurity concentration in the substrate 100 adjacent to the gate pattern 190'. After a photoresist pattern (not shown) is formed on a region of the substrate 100, for example, a P-MOS transistor region, the impurity region 150 having a low impurity concentration may be formed.

A gate spacer 160 is formed on a sidewall of the gate pattern 190'. Impurities are implanted into the substrate 100 using the gate spacer 160 and the gate pattern 190' as an ion implanting mask to form a impurity region 170 having a high impurity concentration in the substrate adjacent to the gate spacer 160. The substrate 100 is thermally treated to activate the impurities in the impurity regions 150 and 170.

The impurity region 170 has an impurity concentration higher than that of the impurity region 150. The impurity regions 150 and 170 include substantially identical impurities. The impurity region 150 having a low impurity concentration is interposed between a channel region disposed under the gate pattern 190' and the impurity region 170 having a high impurity concentration. The impurity regions 150 and 170 form a lightly doped drain (LDD) structure.

The ion implanting processes for forming the impurity regions 150 and 170 are performed on the exposed surface of the substrate 100. To minimize an ion channeling effect generated in the ion implanting processes, a buffer layer may be formed on the exposed surface of the substrate 100 or an inclined ion implanting process may be used.

The dielectric layer pattern 125 covers a sidewall of the metal barrier pattern 135' used as a gate electrode. Thus, the decrease in the channel length caused by diffusing the impurities into the channel region during the thermal treating process may be minimized to the thickness of the dielectric layer pattern 125.

Figure 5:
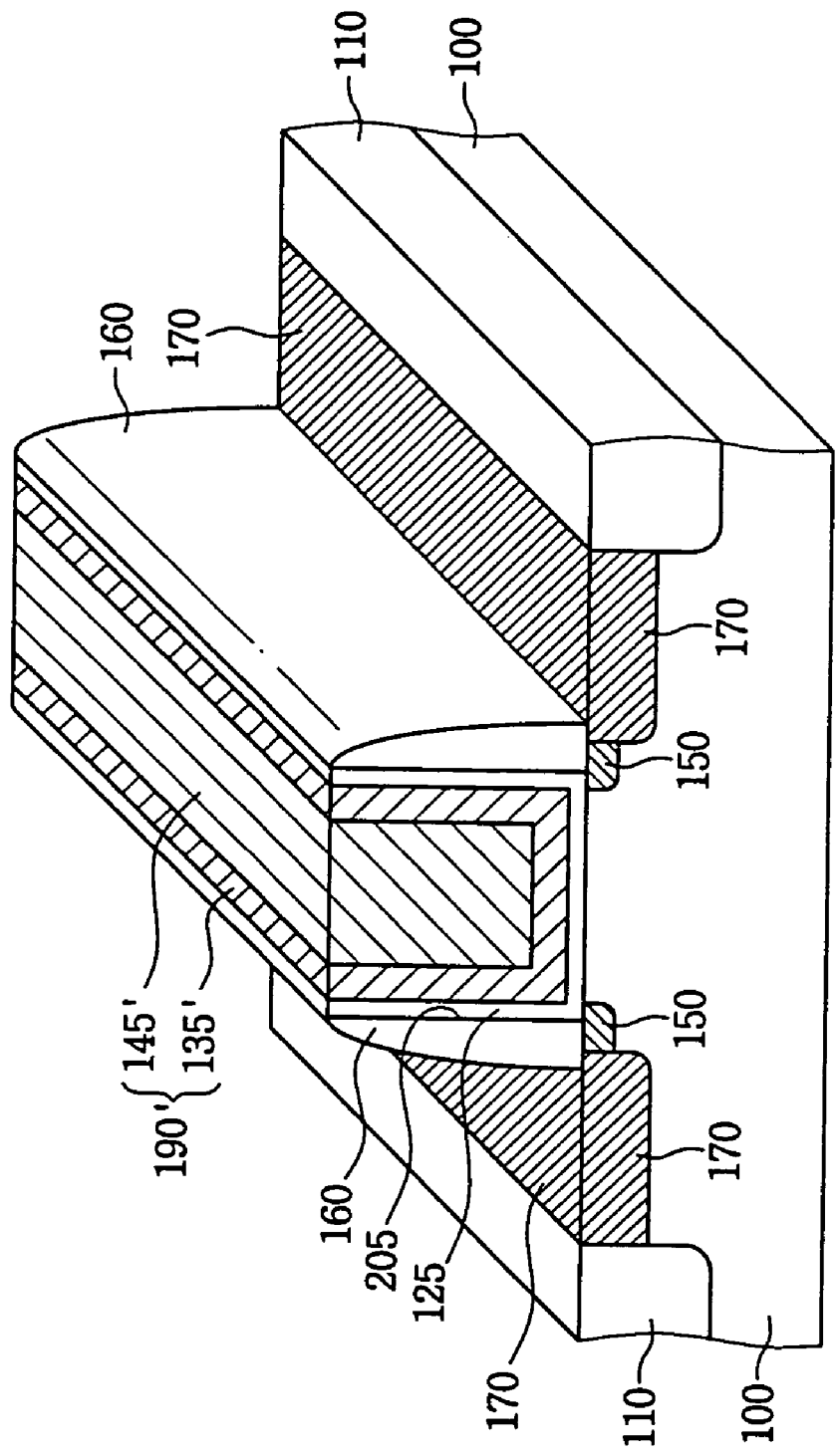
FIG. 5 is a perspective view illustrating a gate electrode formed in accordance with FIGS. 3A to 3C according to some embodiments of the present invention.

FIG. 5 is a perspective view illustrating a gate electrode formed in accordance with the second embodiment of the present invention.

Referring to FIG. 5, the isolation layer 110 defining the active region is disposed in the substrate 100. The gate pattern 190' traversing between the isolation layers 110 is disposed on the active region. The gate spacer 160 is disposed on the sidewall of the gate pattern 190. The gate pattern 190 includes the metal barrier pattern 135' and the gate metal pattern 145'.

The impurity region 150 having a low impurity concentration is disposed in the substrate 100 around the gate pattern 190'. The impurity region 170 having a high impurity concentration is disposed in the substrate 100 around the gate spacer 160. The impurity regions 150 and 170 may include an impurity having a substantially identical conductive type that is opposite to that of the substrate 100. The impurity region 170 having a high impurity concentration has a concentration higher and a depth deeper than those of the impurity region 150 having a low impurity concentration, respectively. Thus, the impurity regions 150 and 170 have a typical LDD structure, thereby serving as the source/drain of the transistor.

The dielectric layer pattern 125 having a high dielectric constant is interposed between the gate spacer 160 and the gate pattern 190'. The dielectric layer 120 serves as the gate insulating layer of the MOS transistor.

The dielectric layer 120 having a high dielectric constant may preferably include a tantalum oxide layer ($Ta_2O_5$), a titanium oxide layer ($TiO_2$), a hafnium oxide layer ($HfO_2$), a zirconium oxide layer ($ZrO_2$), an aluminum oxide layer ($Al_2O_3$), an yttrium oxide layer ($Y_2O_3$), a niobium oxide layer ($Nb_2O_5$), a cesium oxide layer ($CeO_2$), an indium oxide layer ($InO_3$), an iridium oxide layer ($IrO_2$), $SrTiO_3$, $PbTiO_3$, $SrRuO_3$, $CaRuO_3$, (Ba, Sr)$TiO_3$, Pb(Zr, Ti)$O_3$, (Pb, La)(Zr, Ti)$O_3$ or (Sr, Ca)$RuO_3$. Alternatively, the dielectric layer 120 having a high dielectric constant may have a laminate structure that includes at least two stacked layers among the above layers used as the dielectric layer 120.

The metal barrier pattern 135' prevents reaction between the dielectric layer 120 and the gate metal layer 140' or the dielectric layer pattern 125 and the gate metal pattern 145'. Accordingly, the metal barrier pattern 135' includes a material reactivity-resistant relative to the dielectric layer 120 and the dielectric layer pattern 125. The material may include tantalum nitride, tungsten nitride or titanium nitride. Additionally, the metal barrier layer 135' preferably includes the tantalum nitride layer that has a work function of about 4.2 eV to about 5.5 eV.

The gate metal pattern 145' includes metal having a low specific resistance. Thus, the gate metal pattern 145' may include tungsten, tantalum, titanium, aluminum, copper, titanium silicide or cobalt silicide. According to the conventional method, the gate metal layer is reacted with the dielectric layer to form a metal oxide layer. However, according to the method of the present invention, the metal barrier layer 130' prevents the formation of the metal oxide layer.

The gate metal layer may be directly formed on the dielectric layer without the formation of the metal barrier layer to form the gate electrode. Here, when the tantalum amine derivatives represented by a chemical formula Ta($NR_1$)($NR_2R_3$)$_3$ in which $R_1$, $R_2$ and $R_3$ represent H or $C_1$–$C_6$ alkyl group is used may be possibly employed in forming the gate electrode.

The tantalum amine derivatives includes Ta(NC($CH_3$)$_2C_2H_5$)(N($CH_3$)$_2$)$_3$). The tantalum amine derivatives may be deposited by a CVD process, a PECVD process, an ALD process or a RMLD process. The reacting gas including $H_2$, $N_2$, $NH_3$, $SiH_4$ or $Si_2H_6$ may be preferably introduced with the tantalum amine derivatives at a temperature of about 100° C. to about 650° C. under a pressure of about 0.01 Torr to about 30 Torr. Additionally, the substrate 100 having the dielectric layer 120 may be thermally treated before forming the gate metal layer 140'. The alternative method for forming the gate electrode without the metal barrier layer is substantially identical to the method for forming the gate electrode with the metal barrier layer, except the formation of the metal barrier layer.

The process for forming the gate electrode may be simplified by omitting the process for forming the metal barrier layer. The gate electrode is plasma-treated to reduce the specific resistance of the gate metal layer.

Embodiments for forming a dual gate electrode may include the following: A gate insulating layer is formed on a substrate having an N-MOS transistor region and P-MOS transistor region. Tantalum amine derivatives represented by a chemical formula Ta($NR_1$)($NR_2R_3$)$_3$ wherein $R_1$, $R_2$ and $R_3$ represent H or $C_1$–$C_6$ alkyl group is introduced onto the gate insulating layer to form a first metal nitride layer. Nitrogen ions are selectively implanted into the first metal nitride layer positioned in the P-MOS transistor region to form a second metal nitride layer having plentiful nitrogen. The first and second metal nitride layers are patterned to form an N-MOS gate electrode in the N-MOS transistor region and a P-MOS gate electrode in the P-MOS transistor region. Here, the second metal nitride layer has a work function higher than that of the first metal oxide layer.

A tantalum amine derivatives includes Ta(NC($CH_3$)$_2C_2H_5$)(N($CH_3$)$_2$)$_3$). The tantalum amine derivatives may be deposited by a CVD process, a PECVD process, an ALD process or a RAALD process. The reacting gas including $H_2$, $N_2$, $NH_3$, $SiH_4$ or $Si_2H_6$ may be preferably introduced with the tantalum amine derivatives.

The gate insulating layer may include a silicon oxide layer, a tantalum oxide layer ($Ta_2O_5$), a titanium oxide layer ($TiO_2$), a hafnium oxide layer ($HfO_2$), a zirconium oxide layer ($ZrO_2$), an aluminum oxide layer ($Al_2O_3$), an yttrium oxide layer ($Y_2O_3$), a niobium oxide layer ($Nb_2O_5$), a cesium oxide layer ($CeO_2$), an indium oxide layer ($InO_3$), an iridium oxide layer ($IrO_2$), $SrTiO_3$, $PbTiO_3$, $SrRuO_3$, $CaRuO_3$, (Ba, Sr)$TiO_3$, Pb(Zr, Ti)$O_3$, (Pb, La)(Zr, Ti)$O_3$ or (Sr, Ca)$RuO_3$. A silicate layer may be further formed on the substrate before forming the gate insulating layer. Additionally, the substrate may be annealed after implanting the nitrogen ions.

A conductive layer may be further formed on the first and second metal nitride layers. The conductive layer has a specific resistance lower than that of the first and second metal nitride layers. The conductive layer may include tungsten, tantalum, titanium, titanium silicide, tungsten suicide or cobalt silicide.

The N-MOS and the P-MOS gate electrodes may be formed by following processes. The conductive layer and the first metal nitride layer are patterned to form an N-MOS metal layer pattern and a first metal nitride layer pattern in the N-MOS transistor region. Simultaneously, the conductive layer and the second metal nitride layer are patterned to form a P-MOS metal layer pattern and a second metal nitride layer pattern in the P-MOS transistor region. Here, the N-MOS gate electrode includes the first metal nitride layer pattern and the N-MOS metal layer pattern. The P-MOS gate electrode includes the second nitride layer pattern and the P-MOS metal layer pattern.

A dual gate electrode may be formed using a damascene process in accordance with the method of the present invention. A mold insulating layer is formed on a substrate having an N-MOS transistor region and P-MOS transistor region. The mold insulating layer is etched to form an N-MOS gate opening exposing the N-MOS transistor region and a P-MOS gate opening exposing the P-MOS transistor region. A gate insulating layer is formed on the mold insulating layer, and a side face and a bottom face of the N-MOS and P-MOS gate openings. Tantalum amine derivatives represented by a chemical formula Ta($NR_1$)($NR_2R_3$)$_3$ wherein $R_1$, $R_2$ and $R_3$ represent H or $C_1$–$C_6$ alkyl group is introduced onto the gate insulating layer to form a metal nitride layer filling the N-MOS and P-MOS gate openings. The metal nitride layer is planarized to form a N-MOS gate electrode in the N-MOS gate opening and a preliminary P-MOS gate electrode in the P-MOS gate opening. Nitrogen ions are selectively implanted into the preliminary P-MOS gate electrode to form a P-MOS gate electrode.

The gate insulating layer may preferably include a dielectric layer that has a dielectric constant higher than that of silicon oxide. The dielectric layer may include a tantalum oxide layer ($Ta_2O_5$), a titanium oxide layer ($TiO_2$), a hafnium oxide layer ($HfO_2$), a zirconium oxide layer ($ZrO_2$), an aluminum oxide layer ($Al_2O_3$), an yttrium oxide layer ($Y_2O_3$), a niobium oxide layer ($Nb_2O_5$), a cesium oxide layer ($CeO_2$), an indium oxide layer ($InO_3$), an iridium oxide layer ($IrO_2$), $SrTiO_3$, $PbTiO_3$, $SrRuO_3$, $CaRuO_3$, (Ba, Sr)$TiO_3$, Pb(Zr, Ti)$O_3$, (Pb, La)(Zr, Ti)$O_3$ or (Sr, Ca)$RuO_3$.

A conformal silicate layer may be further formed on the substrate before forming the gate insulating layer. Alternatively, the gate insulating layer may include a thermal oxide layer. The thermal oxide layer may be formed on the N-MOS and the P-MOS transistor regions.

Additionally, the substrate having the preliminary P-MOS gate electrode may be annealed. After the P-MOS gate electrode is formed, the gate insulating layer and the mold insulating layer may be removed by an isotropic etching process.

FIGS. 6A to 6E are cross sectional views illustrating a method for forming a dual gate electrode in accordance with some embodiments of the present invention. In FIGS. 6A to 6E, reference numerals "I" and "II" represent an N-MOS transistor region and a P-MOS transistor region, respectively.

Figure 6A:
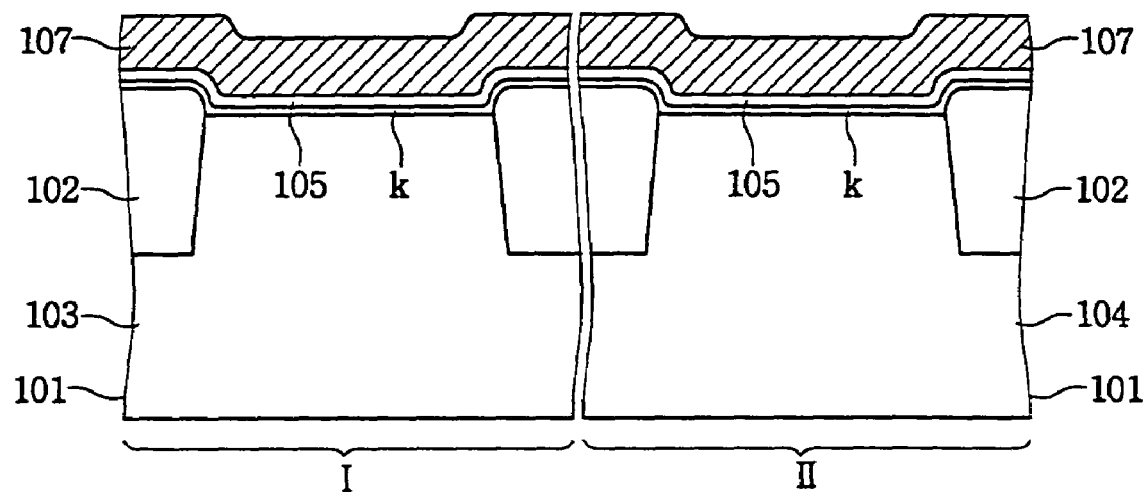
FIGS. 6A to 6E are cross sectional views illustrating methods for forming a dual gate electrode in accordance with some embodiments of the present invention.

Referring to FIG. 6A, an isolation layer 102 is formed on a substrate 101 to define active regions. An active region positioned in the N-MOS transistor region I is a P type active region 103. An active region positioned in the P-MOS transistor 11 is an N type active region 104.

P type impurity ions may be implanted into the active region to form the P type active region 103. N type impurity ions may be implanted into the active region to form the N type active region 104. Alternatively, the isolation layer may be formed in a P type substrate to form the P type active region 103. N type impurity ions may be implanted into the P type active region 103 positioned in the P-MOS transistor region 11 to form the N type active region 104. On the contrary, the isolation layer may be formed in an N type substrate to form the N type active region 104. P type impurity ions may be implanted into the N type active region 104 positioned in the N-MOS transistor region I to form the P type active region 103.

A silicate layer K is formed on the substrate 101 and the isolation layer 102. A gate insulating layer 105 is formed on the silicate layer K. A first metal nitride layer 107 including tantalum nitride is formed on the gate insulating layer 105.

The gate insulating layer 105 may include a dielectric layer that has a dielectric constant higher than that of silicon oxide. The dielectric layer may include a tantalum oxide layer ($Ta_2O_5$), a titanium oxide layer ($TiO_2$), a hafnium oxide layer ($HfO_2$), a zirconium oxide layer ($ZrO_2$), an aluminum oxide layer ($Al_2O_3$), an yttrium oxide layer ($Y_2O_3$), a niobium oxide layer ($Nb_2O_5$), a cesium oxide layer ($CeO_2$), an indium oxide layer ($InO_3$), an iridium oxide layer ($IrO_2$), $SrTiO_3$, $PbTiO_3$, $SrRuO_3$, $CaRuO_3$, $(Ba, Sr)TiO_3$, $Pb(Zr, Ti)O_3$, $(Pb, La)(Zr, Ti)O_3$ or $(Sr, Ca)RuO_3$.

The silicate layer k prevents a formation of a silicon oxide layer that is formed from a reaction between the dielectric layer and the substrate 101. For example, when the gate insulating layer 105 include the hafnium oxide layer, the silicate layer K is reacted with the hafnium oxide layer to form a hafnium silicate oxide layer. The hafnium silicate oxide layer may have a thickness less than that of a hafnium silicate oxide layer that is formed by a reaction between the hafnium oxide layer and the substrate. Thus, the final silicate layer may have a minimum thickness because the silicate layer k has a thickness less than that of a silicate layer formed by a reaction between the oxide layer and the substrate. However, when the gate insulating layer 105 includes silicon oxide, it is not necessary to form the silicate layer k.

The tantalum nitride layer including $Ta(NC(Ch_3)_2C_2H_5)(N(CH_3)_2)_3)$ may be formed by a CVD process, a PECVD process, an ALD process or a RAALD process. A reacting gas including $H_2$, $N_2$, $NH_3$, $SiH_4$ or $Si_2H_6$ may be preferably introduced with $Ta(NC(Ch_3)_2C_2H_5)(N(CH_3)_2)_3)$.

Figure 6B:
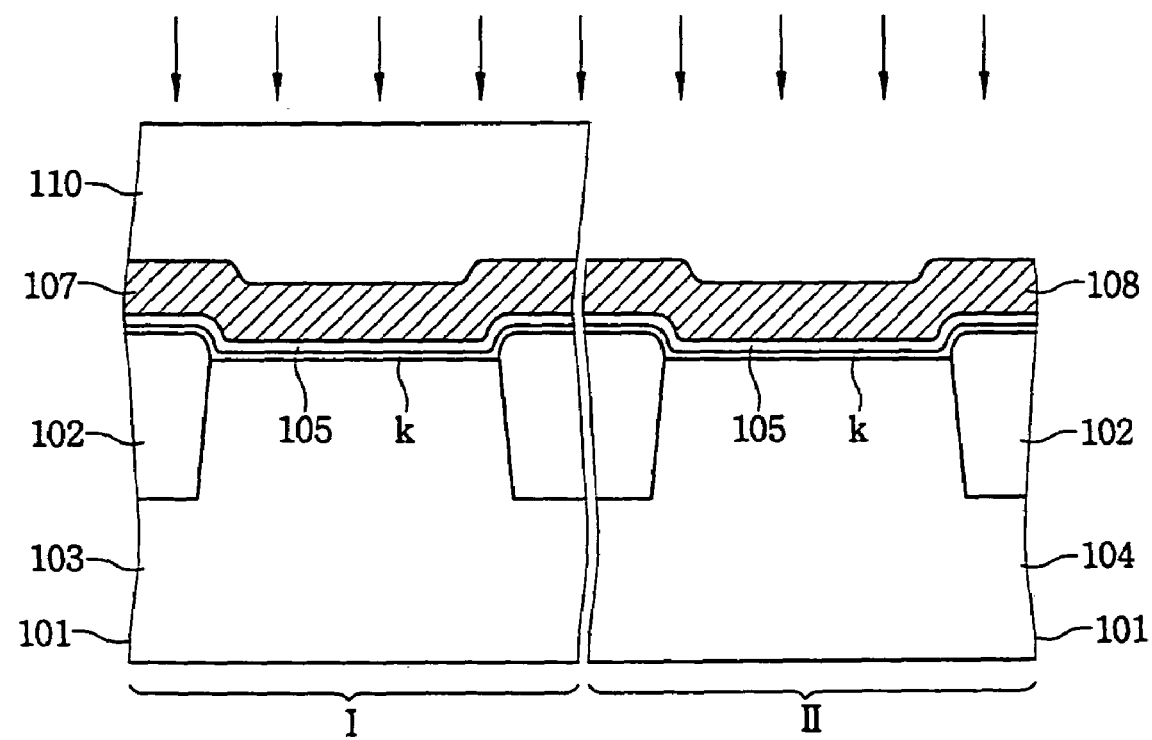

Referring to FIG. 6B, a photoresist pattern 110 exposing the first metal nitride layer 107 positioned in the P-MOS transistor region 11 is formed on the first metal oxide layer 107. Nitrogen ions are implanted into the exposed first metal nitride layer 107 to form a second metal oxide layer 108 having rich nitrogen. The substrate 101 may be preferably annealed to activate the nitrogen ions in the second metal oxide layer 108. Generally, the metal nitride layer has a high work function proportional to a high concentration of the nitrogen ions. Thus, the second metal nitride layer 108 has a work function higher than that of the first metal nitride layer 107.

Figure 6C:
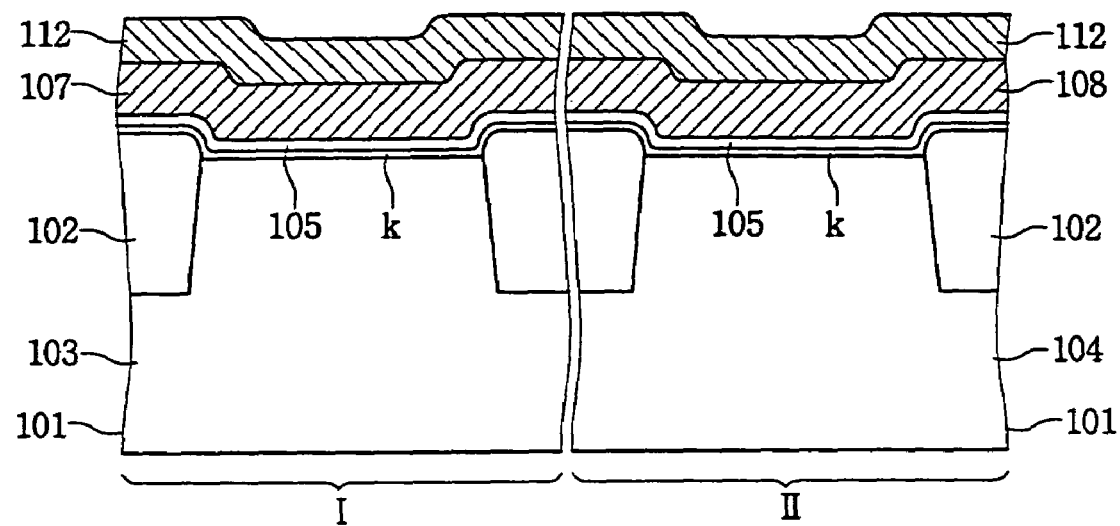

Referring to FIG. 6C, the photoresist pattern 110 is removed. A metal layer 112 is formed on the first and second metal nitride layers 107 and 108. The metal layer 112 may include a material having a specific resistance lower than that of the first and second metal nitride layers 107 and 108. The metal layer 112 may include tungsten, tantalum, titanium, titanium silicide, tungsten silicide or cobalt silicide.

Figure 6D:
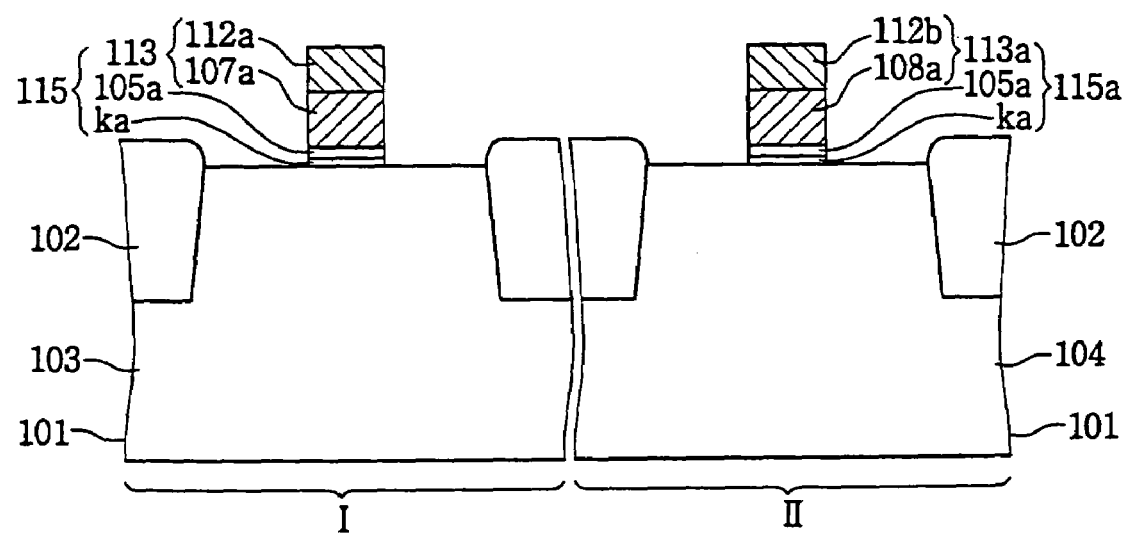

Referring to FIG. 6D, the metal layer 112, the first metal nitride layer 107, the gate insulating layer 105 and the silicate layer k are patterned to form an N-MOS gate pattern 115 on the P type active region 103. The N-MOS gate pattern 115 includes a silicate layer pattern ka, a gate insulating layer pattern 105a, a first metal nitride layer pattern 107a and an N-MOS metal layer pattern 112a subsequently stacked on the P type active region 103. An N-MOS gate electrode 113 includes the first metal nitride layer pattern 107a and the N-MOS metal layer pattern 112a.

Simultaneously, the metal layer 112, the second metal nitride layer 108, the gate insulating layer 105 and the silicate layer k are patterned to form a P-MOS gate pattern 115a on the N type active region 104. The P-MOS gate pattern 115a includes the silicate layer pattern ka, the gate insulating layer pattern 105a, a second metal nitride layer pattern 108a and a P-MOS metal layer pattern 112b subsequently stacked on the N type active region 104. A P-MOS gate electrode 113a includes the second metal nitride layer pattern 108a and the P-MOS metal layer pattern 112b. The N-MOS and P-MOS gate patterns 115 and 115a are simultaneously formed so that the processes for forming a dual gate electrode may be simplified.

Figure 6E:
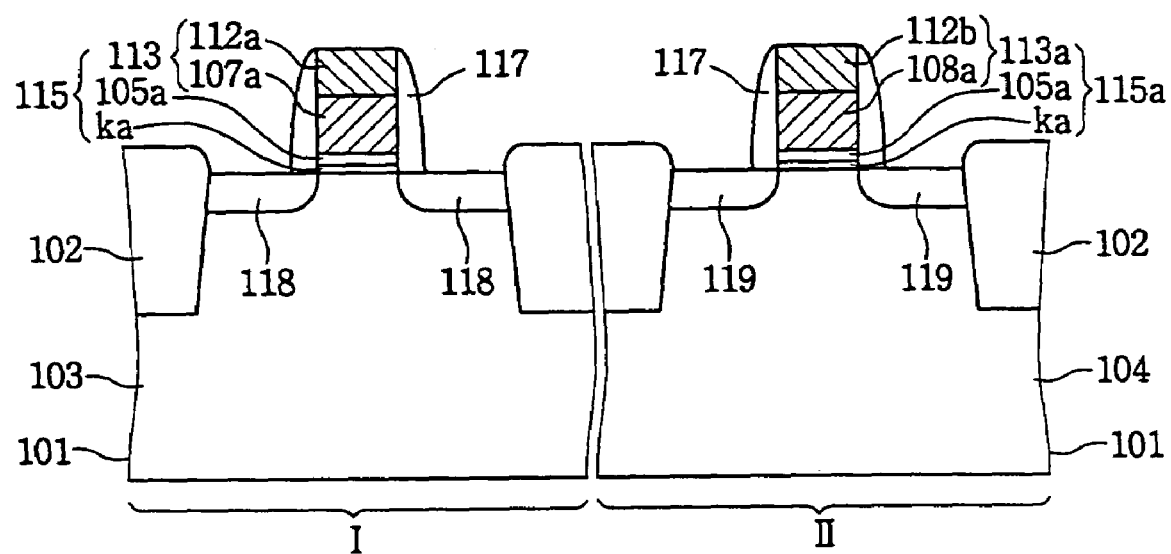

Referring to FIG. 6E, a gate spacer 117 is formed on sidewalls of the N-MOS and P-MOS gate patterns 115 and 115a. N type impurity ions are implanted into the P type active region 103 around the N-MOS gate pattern 115 to form N-MOS source/drain regions 118. P type impurity ions are implanted into the N type active region 104 around the P-MOS gate pattern 115a to form P-MOS source/drain regions 119.

FIGS. 7A to 7E are cross sectional views illustrating a method for forming a dual gate electrode in accordance with a fourth embodiment of the present invention. In FIGS. 7A to 7E, reference numerals "III" and "IV" represent an N-MOS transistor region and a P-MOS transistor region, respectively.

Figure 7A:
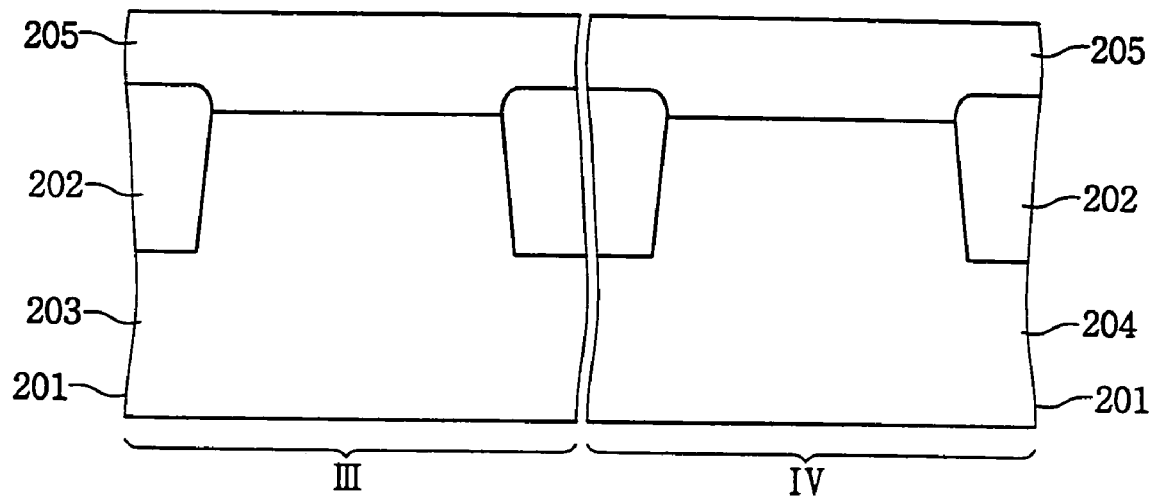
FIGS. 7A to 7E are cross sectional views illustrating a method for forming a dual gate electrode in accordance with some embodiments of the present invention.

Referring to FIG. 7A, an isolation layer 202 is formed on a substrate 201 to define active regions. An active region positioned in the N-MOS transistor region III is a P type active region 203. An active region positioned in the P-MOS transistor IV is an N type active region 204.

P type impurity ions may be implanted into the active region to form the P type active region 203. N type impurity ions may be implanted into the active region to form the N type active region 204. Alternatively, the isolation layer may be formed in a P type substrate to form the P type active region 203. N type impurity ions may be implanted into the P type active region 203 positioned in the P-MOS transistor region IV to form the N type active region 204. On the contrary, the isolation layer may be formed in an N type substrate to form the N type active region 204. P type impurity ions may be implanted into the N type active region 204 positioned in the N-MOS transistor region III to form the P type active region 203. A mold insulating layer 205 is formed on the substrate 201. The mold insulating layer 205 may include a silicon oxide layer that is formed by a CVD process.

Figure 7B:
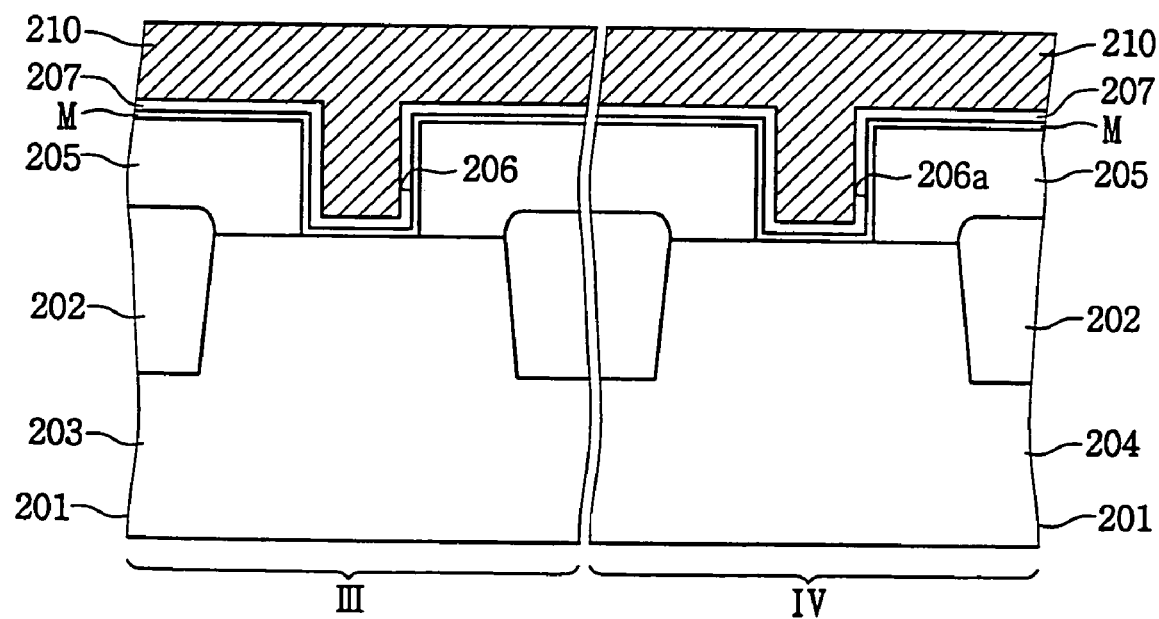

Referring to FIG. 7B, the mold insulating layer 205 is etched to form an N-MOS gate opening 206 exposing the P type active region 203 and a P-MOS gate opening 206a exposing the N type active region 204. A conformal silicate layer M is formed on the mold insulating layer 205, and side faces and bottom faces of the N-MOS and P-MOS gate openings 206 and 206a. A gate insulating layer 207 is formed on the silicate layer M. The gate insulating layer 207 may include a dielectric layer that has a dielectric constant higher than that of silicon oxide. The dielectric layer may include a tantalum oxide layer ($Ta_2O_5$), a titanium oxide layer ($TiO_2$), a hafnium oxide layer ($HfO_2$), a zirconium oxide layer ($ZrO_2$), an aluminum oxide layer ($Al_2O_3$), an yttrium oxide layer ($Y_2O_3$), a niobium oxide layer ($Nb_2O_5$), a cesium oxide layer ($CeO_2$), an indium oxide layer ($InO_3$), an iridium oxide layer ($IrO_2$), $SrTiO_3$, $PbTiO_3$, $SrRuO_3$, $CaRuO_3$, $(Ba, Sr)TiO_3$, $Pb(Zr, Ti)O_3$, $(Pb, La)(Zr, Ti)O_3$ or $(Sr, Ca)RuO_3$.

The silicate layer M prevents a formation of a silicon oxide layer that is formed from a reaction between the dielectric layer and the substrate 201. A final silicate layer may have a minimum thickness because the silicate layer M has a thickness less than that of a silicate layer formed by a reaction the oxide layer and the substrate. However, when the gate insulating layer 207 includes silicon oxide, it is not necessary to form the silicate layer M. Also, when the gate insulating layer 207 includes a silicon oxide layer having thermal oxide, the gate insulating layer 207 may be formed on only surfaces of the P type and N type active regions 203 and 204.

The tantalum nitride layer including $Ta(NC(CH_3)_2C_2H_5)(N(CH_3)_2)_3$ may be formed by a CVD process, a PECVD process, an ALD process or a RAALD process. A reacting gas including $H_2$, $N_2$, $NH_3$, $SiH_4$ or $Si_2H_6$ may be introduced with $Ta(NC(CH_3)_2C_2H_5)(N(CH_3)_2)_3$.

A metal nitride layer 210 including tantalum nitride is formed on the gate insulating layer 207 using TAIMATA to fill the N-MOS and P-MOS gate openings 206 and 206a. The metal nitride layer 210 has improved oxidization-resistance relative to the gate insulating layer 207 compared to a pure metal layer. Thus, the oxidization of the tantalum nitride layer by being reacted with the gate insulating layer 207 during a conventional nitrification process may be minimized.

Figure 7C:
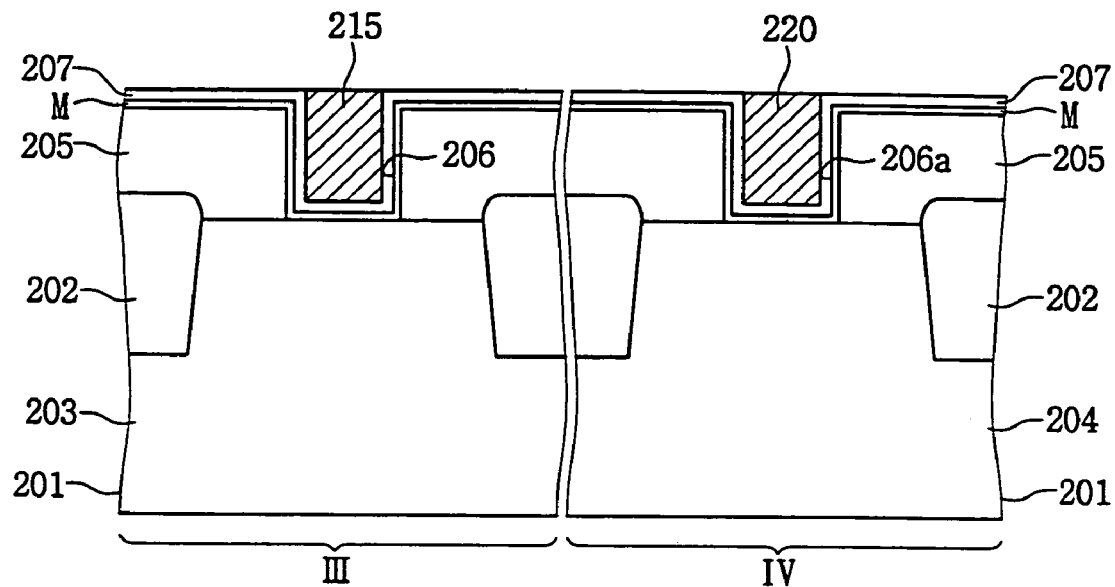

Referring to FIG. 7C, the metal nitride layer 210 is planarized for exposing the gate insulating layer 207 to form an N-MOS gate electrode 215 in the N-MOS gate opening 206 and a preliminary P-MOS gate electrode 220 in the P-MOS gate opening 206a. When the gate insulating layer 207 includes a thermal oxide layer, the metal nitride layer 210 is planarized to expose the mold insulating layer 205.

Figure 7D:
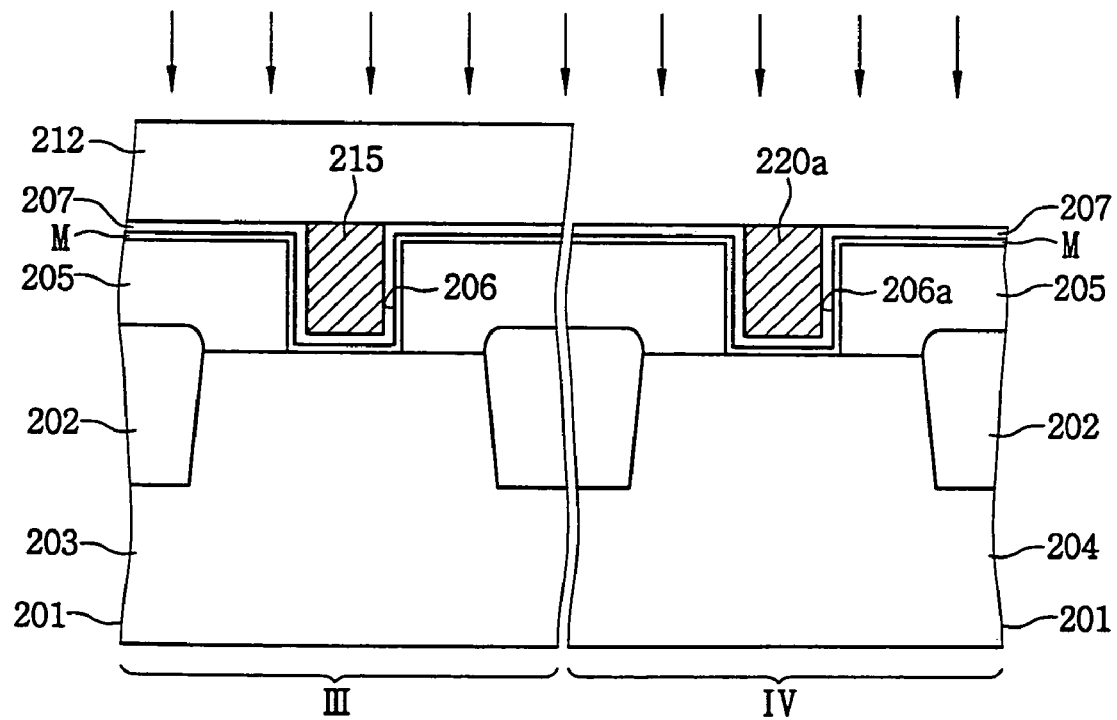

Referring to FIG. 7D, a photoresist pattern 212 exposing the P-MOS transistor region IV is formed on the gate insulating layer 207 and the N-MOS gate electrode 215. As a result, the preliminary P-MOS gate electrode 220 is exposed. Nitrogen ions are implanted into the exposed P-MOS gate electrode 220 to form a P-MOS gate electrode 220a having rich nitrogen. Thus, the P-MOS gate electrode 220a has a work function higher than that of the N-MOS gate electrode 215.

Figure 7E:
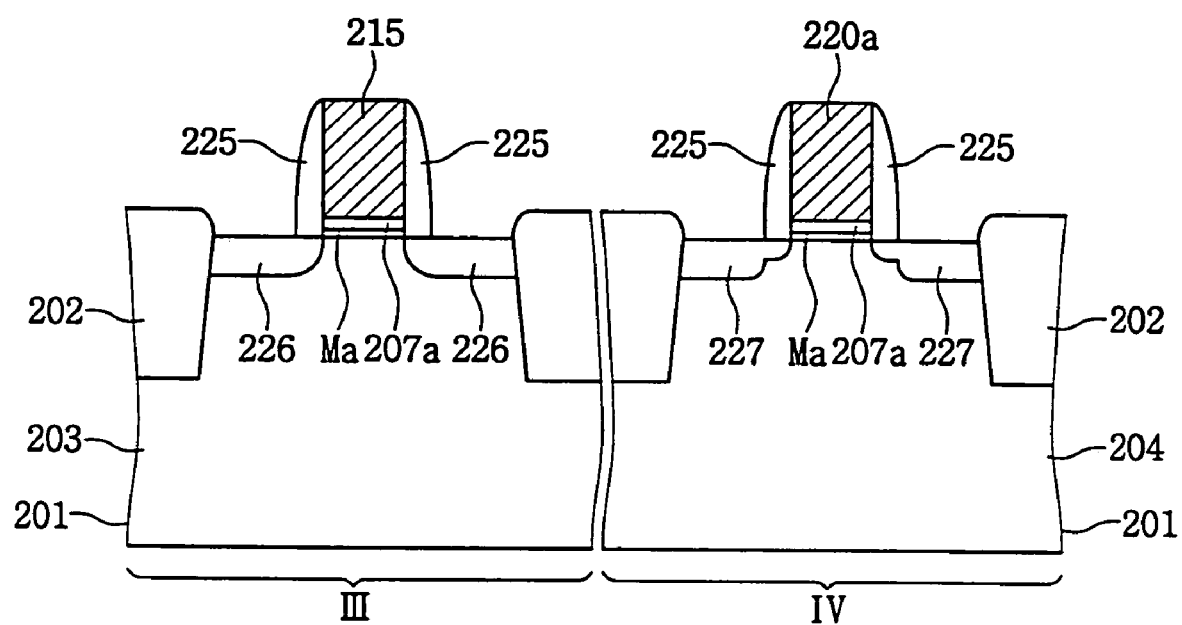

Referring to FIG. 7E, the photoresist pattern 212 is removed to expose the gate insulating layer 207 and the N-MOS gate electrode 215. The gate insulating layer 207, the silicate layer M and the mold insulating layer 205 are isotropically etched to form a gate insulating layer pattern 207a and a silicate layer pattern Ma. A gate spacer 225 is formed on sidewalls of the gate electrodes 215 and 220a. N type impurity ions are implanted into the P type active region 203 to form N-MOS source/drain regions 226. P type impurity ions are implanted into the N type active region 204 to form P-MOS source/drain regions 227.

Embodiments of the present invention may also include methods for forming a capacitor. In a method for forming a capacitor, Tantalum amine derivatives represented by a chemical formula $Ta(NR_1)(NR_2R_3)_3$ in which $R_1$, $R_2$ and $R_3$ represent H or $C_1$–$C_6$ alkyl group is introduced onto a substrate to form a first electrode. A dielectric layer is formed on the first electrode. A second electrode is formed on the dielectric layer.

Alternatively, a first electrode is formed on a substrate. A dielectric layer is formed on the first electrode. Tantalum amine derivatives represented by a chemical formula $Ta(NR_1)(NR_2R_3)_3$ in which $R_1$, $R_2$ and $R_3$ represent H or $C_1$–$C_6$ alkyl group is introduced onto the dielectric layer to form a second electrode.

The reaction between the electrodes including tantalum nitride and the dielectric layer including metal oxide may be substantially reduced. Therefore, the capacitor fabricated using the methods may consistently operate with displaying improved performance. Further, a metal oxide layer having a high dielectric constant may be readily formed so that the capacitor has a high capacitance.

A first electrode including tantalum nitride is formed on a substrate using TAIMATA at a temperature of about 100° C. to about 650° under a pressure of about 0.01 Torr to about 30 Torr. TAIMATA may be preferably introduced in a gaseous state onto the substrate using a bubbler or a liquid delivery system (LDS). The first electrode may be formed by an ALD process, a RAALD process, a CVD process or a PECVD process.

Additionally, the first electrode may be post-treated using radio frequency (RF) plasma to remove impurities remaining in the first electrode. The RF plasma may be generated through a remote plasma method or a direct plasma method that activates $H_2$, $NH_3$, $SiH_4$ or $Si_2H_6$ or a mixture thereof. The remote plasma method may allow for the RF plasma to be generated outside of the chamber and then introduced into the chamber. The direct plasma method generates the RF plasma inside of the chamber. The first electrode including tantalum nitride is formed by an ALD process or a CVD process using the tantalum precursor.

A dielectric layer is formed on the first electrode. The dielectric layer includes a metal oxide layer. The metal oxide layer includes a tantalum oxide layer ($Ta_2O_5$), a titanium oxide layer ($TiO_2$), a hafnium oxide layer ($HfO_2$), a zirconium oxide layer ($ZrO_2$), an aluminum oxide layer ($Al_2O_3$), an yttrium oxide layer ($Y_2O_3$), a niobium oxide layer ($Nb_2O_5$), a cesium oxide layer ($CeO_2$), an indium oxide layer ($InO_3$), an iridium oxide layer ($IrO_2$), $SrTiO_3$, $PbTiO_3$, $SrRuO_3$, $CaRuO_3$, $(Ba, Sr)TiO_3$, $Pb(Zr, Ti)O_3$, $(Pb, La)(Zr, Ti)O_3$ or $(Sr, Ca)RuO_3$.

A second electrode is formed on the dielectric layer. The second electrode includes tantalum nitride, polysilicon, ruthenium, platinum, iridium, titanium nitride, tantalum nitride or tungsten nitride. When the second electrode does not include tantalum nitride, a capping layer may be further formed on the second electrode. The capping layer includes tantalum nitride. When the second electrode includes tantalum nitride, the second electrode may be formed by processes substantially identical to that employed for forming the first electrode. As a result, a capacitor including the first electrode, the dielectric layer and the second electrode is manufactured. The first electrode corresponds to a lower electrode of the capacitor, and the second electrode corresponds to an upper electrode of the capacitor. Particularly, the first electrode corresponds to a storage node electrode of the capacitor, and the second electrode corresponds to a plate electrode of the capacitor.

Embodiments of the present invention the metal oxide layer having a high dielectric constant is used as the dielectric layer wherein the metal oxide layer is tantalum nitride. This may allow for a capacitor having a high capacitance to be manufactured. Furthermore, the reaction between the first and/or the second electrodes including tantalum nitride and the dielectric layer including metal oxide may be substantially reduced. Thus, the capacitor consistently operates with displaying improved performance.

Embodiments of the present invention include methods employed in manufacturing a dynamic random access memory (DRAM) device of one giga-bite storage capacity drive.

FIGS. 8A to 8G are cross sectional views illustrating a method for forming a capacitor in accordance with a fifth embodiment of the present invention.

Figure 8A:
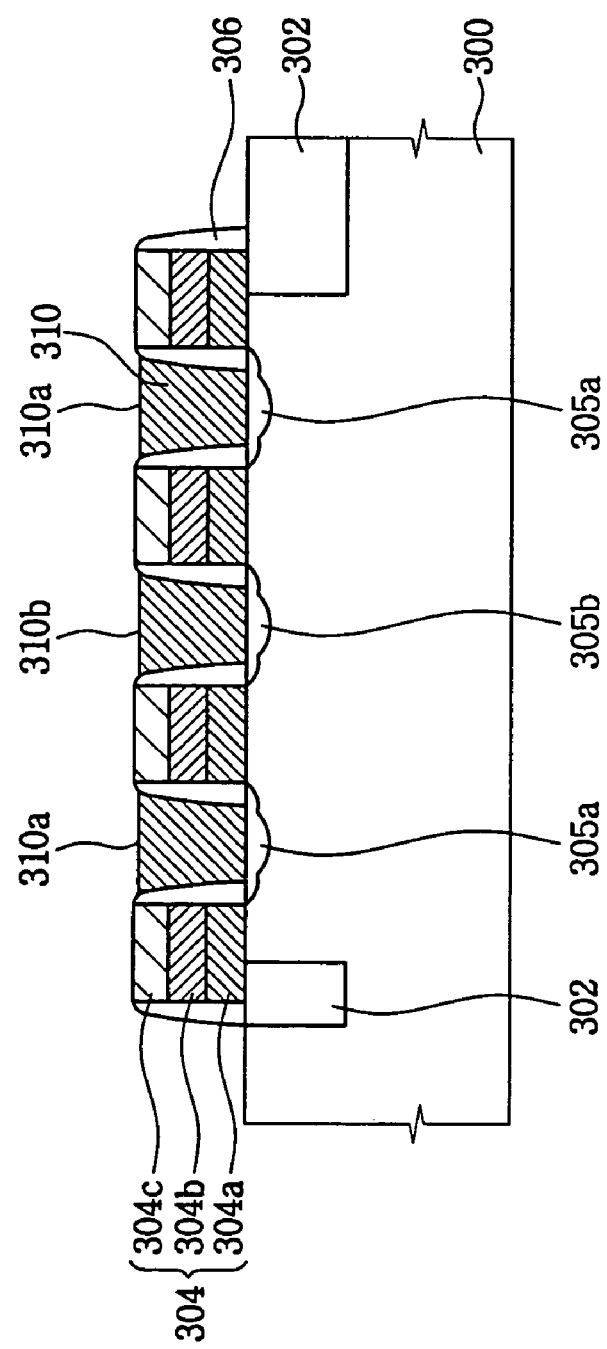
FIGS. 8A to 8G are cross sectional views illustrating a method for forming a capacitor in accordance with some embodiments of the present invention.

Referring to FIG. 8A, a trench structure 302 is formed in a substrate 300 by an isolation process to divide the substrate 300 into an active region and an inactive region. Impurities are implanted into the substrate 300 to form a P type well and an N type well. A gate pattern 304 is formed on the active region of the substrate 300. The gate pattern 304 includes a polysilicon layer 304a doped with an impurity having a high impurity concentration, a tungsten silicide layer 304b and a silicon nitride layer 304c that are subsequently stacked on the active region. The gate pattern 304 serves as a word line of the DRAM device. Additionally, a gate spacer 306 may be formed on a sidewall of the gate pattern 304.

Impurities are implanted into the substrate 300 using the gate pattern 304 as an ion implanting mask to form source/drain regions 305a and 305b adjacent to the gate pattern 304. Accordingly, a transistor structure including the gate pattern 304 and the source/drain regions 305a and 305b is completed. One of the source/drain regions 305a and 305b corresponds to a capacitor contact region connected to a lower electrode of a capacitor. The other region corresponds to a bit line contact region connected to a bit line structure. In this embodiment, the source region 305a corresponds to the capacitor contact region, and the drain region 305b corresponds to the bit line contact region.

The space between the gate pattern 304 is filled with a polysilicon layer 310 to form a capacitor contact pad 310a electrically contacted with the lower electrode of the capacitor and a bit line contact pad 310b electrically contacted with the bit line structure. Here, the polysilicon layer 310 positioned in the capacitor contact region corresponds to the capacitor contact pad 310a, and the polysilicon layer 310 positioned in the bit line contact region corresponds to the bit line contact pad 310b.

Figure 8B:
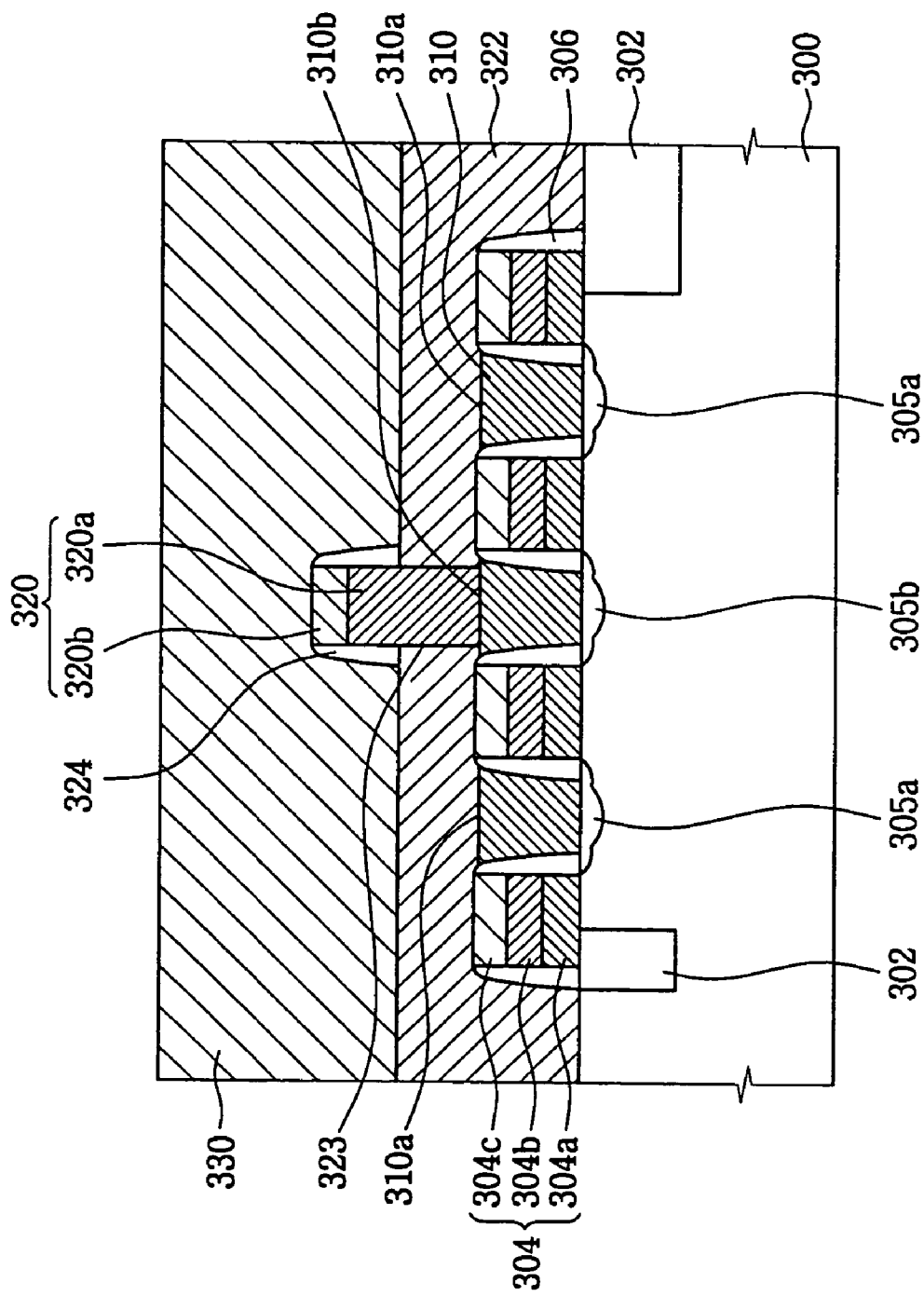

Referring to FIG. 8B, a bit line structure 320 electrically contacted with the bit line contact pad 310b is formed. Particularly, a first insulating interlayer 322 is formed on the gate pattern 304 and the polysilicon layer 310. The first insulating interlayer 322 is partially etched by a typical photolithography process to form a bit line contact hole 323 exposing an upper face of the bit line contact pad 310b. A tungsten layer 320a is formed on the first insulating interlayer 322 to fill the bit line contact hole 323. A silicon nitride layer 320b is formed on the tungsten layer 320a. The tungsten layer 320a and the silicon nitride layer 320b are partially etched by a typical photolithography process to form the bit line structure 320 including the tungsten layer 320a and the silicon nitride layer 320b.

A silicon nitride layer is formed on the bit line structure 320 and the first insulating interlayer 322. The silicon nitride layer is etched to form a spacer structure 324 on a sidewall of the bit line structure 320. Thus, the tungsten layer 320a is covered by the silicon nitride layer 320b and is also surrounded by the spacer structure 324. A second insulating interlayer 330 including silicon oxide is formed on the bit line structure 320, the spacer structure 324 and the first insulating interlayer 322. Silicon oxide may be deposited using a high density plasma.

Figure 8C:
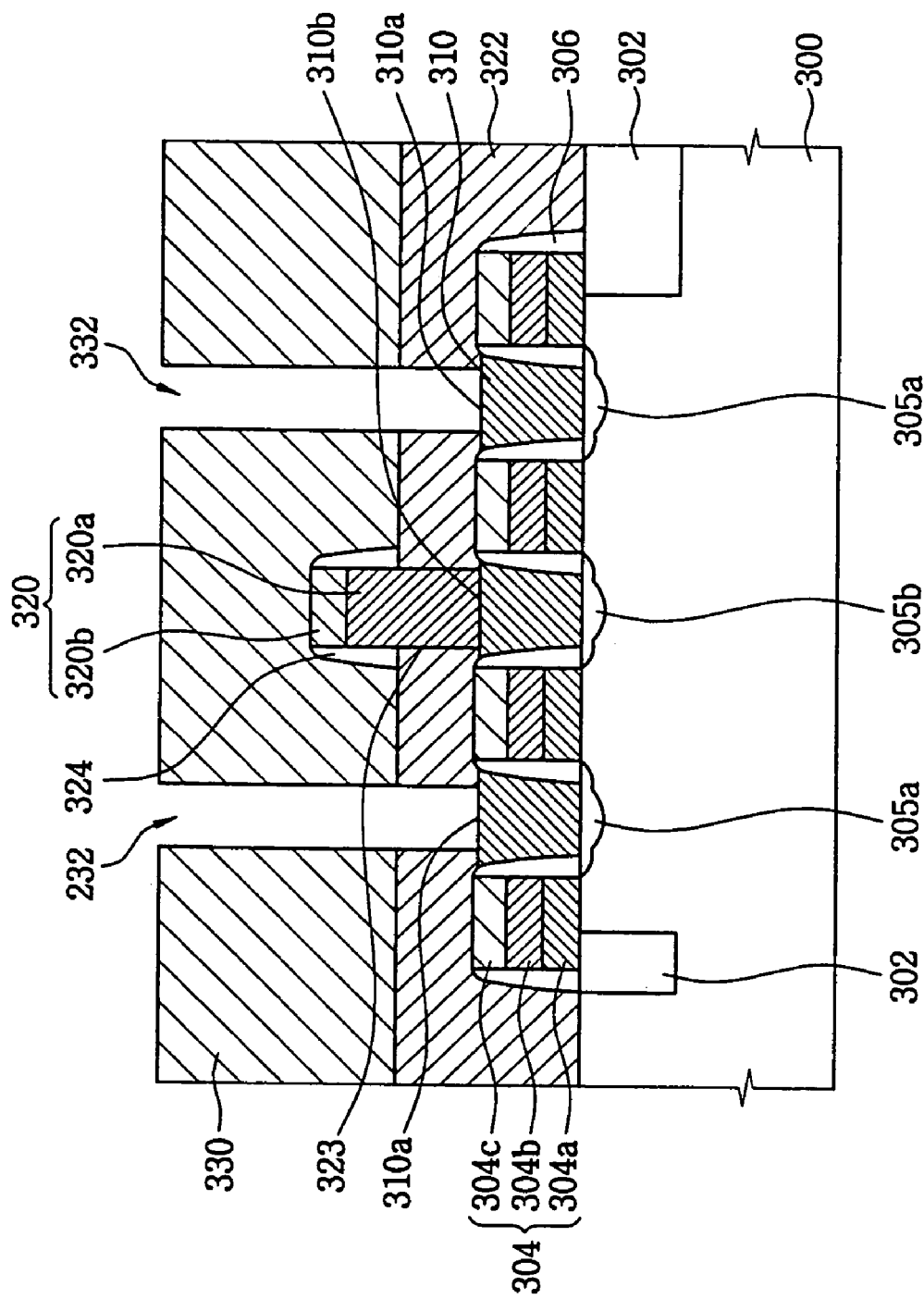

Referring to FIG. 8C, the first and second insulating interlayers 322 and 330 are etched to form a self-align contact hole 332 exposing an upper face of the capacitor contact pad 310a. The capacitor contact pad 310a is formed by a difference of an etching rate between silicon nitride in the bit line structure 320 and the spacer structure 324 and silicon oxide in the first and second insulating interlayers 322 and 330.

Figure 8D:
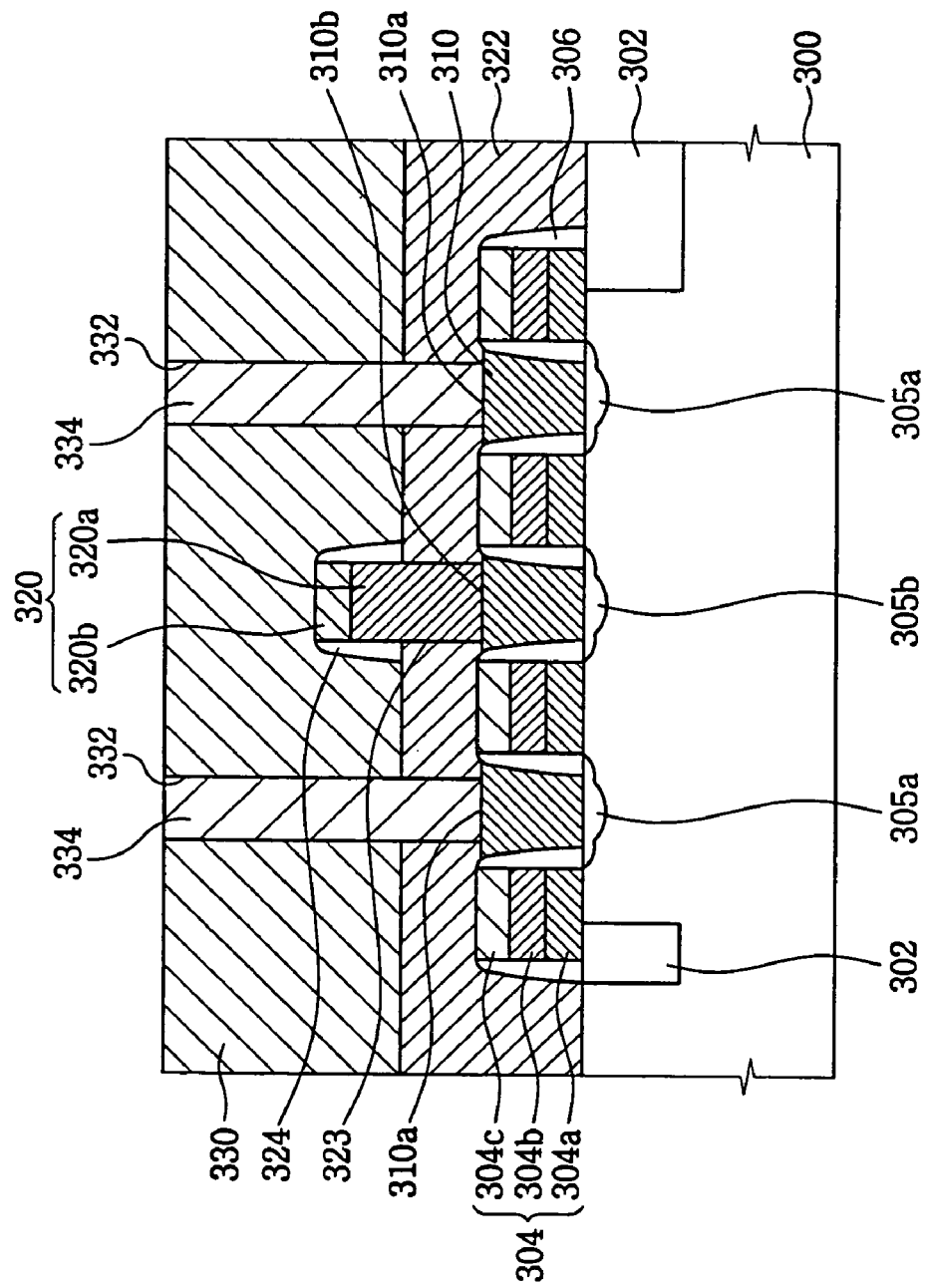

Referring to FIG. 8D, the self-align contact hole 332 is filled with the lower electrode layer 334 of the capacitor. The lower electrode layer 334 including tantalum nitride may be formed by an ALD process or a CVD process.

Figure 8E:
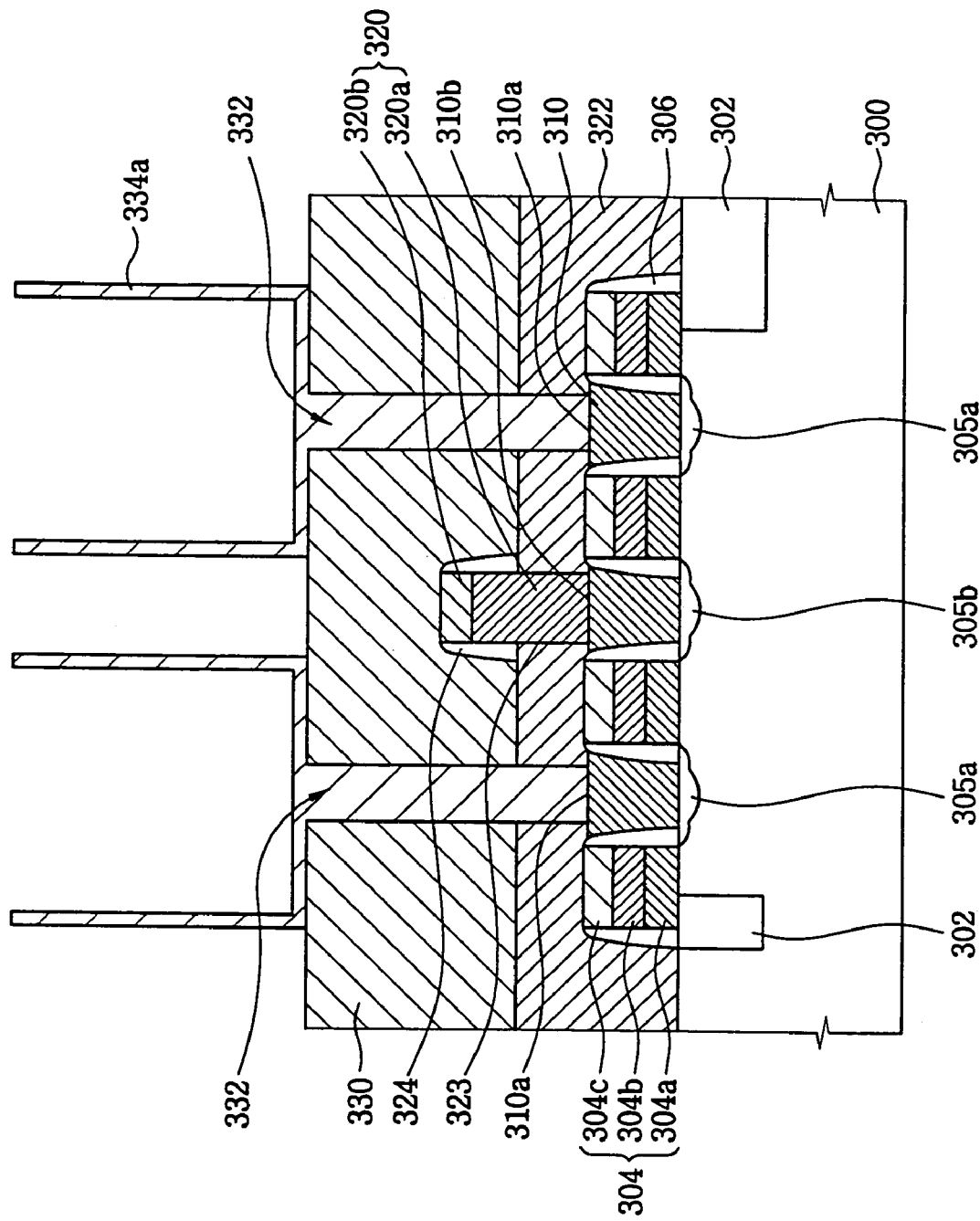

Referring to FIG. 8E, the lower electrode layer 334 is etched by a typical photolithography process to form a lower electrode 334a having a cylindrical shape.

A first lower electrode layer is formed on the second insulating interlayer 330 to fill the self-align contact hole 332. The first lower electrode layer is etched by a CMP process to expose an upper face of the second insulating interlayer 330. As a result, the first lower electrode layer is only positioned in the self-align contact hole 332. An oxide layer (not shown) is formed on the second insulating interlayer 330 and the first lower electrode layer. The oxide layer is etched to form an oxide layer pattern having a cylindrical shape. A second lower electrode layer is formed on the oxide layer pattern. The oxide layer pattern is removed to form the lower electrode 334a having the cylindrical shape.

Figure 8F:
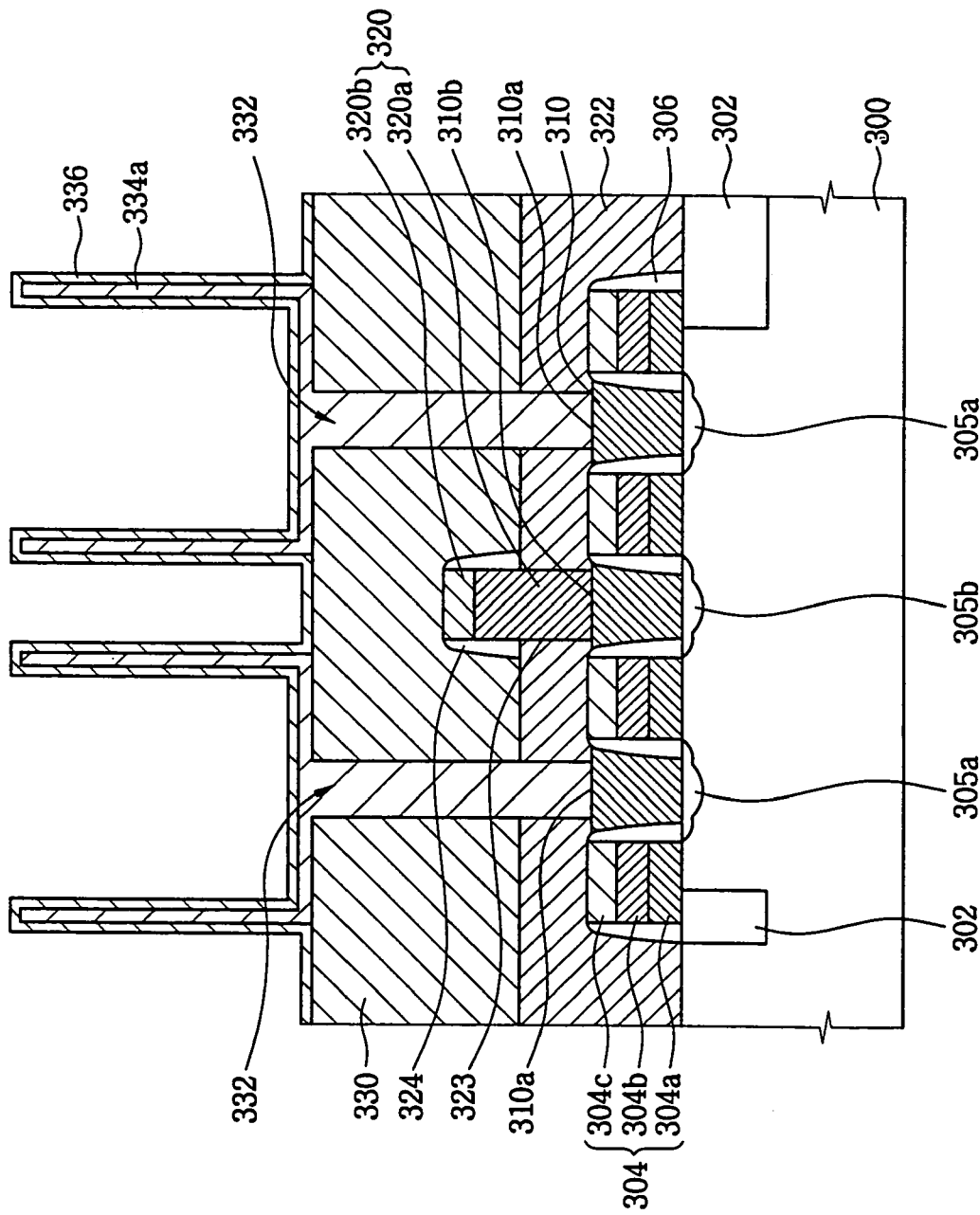

Referring to FIG. 8F, a dielectric layer 336 is formed on the lower electrode 334a. The dielectric layer 336 includes a metal oxide in accordance with the present invention. The dielectric layer 336 includes tantalum oxide($Ta_2O_5$), titanium oxide ($TiO_2$), hafnium oxide ($HfO_2$), zirconium oxide ($ZrO_2$), aluminum oxide ($Al_2O_3$), yttrium oxide ($Y_2O_3$), niobium oxide ($Nb_2O_5$), cesium oxide ($CeO_2$), indium oxide ($InO_3$), iridium oxide ($IrO_2$), $SrTiO_3$, $PbTiO_3$, $SrRuO_3$, $CaRuO_3$, (Ba, Sr)$TiO_3$, Pb(Zr, Ti)$O_3$, (Pb, La)(Zr, Ti)$O_3$ or (Sr, Ca)$RuO_3$.

Figure 8G:
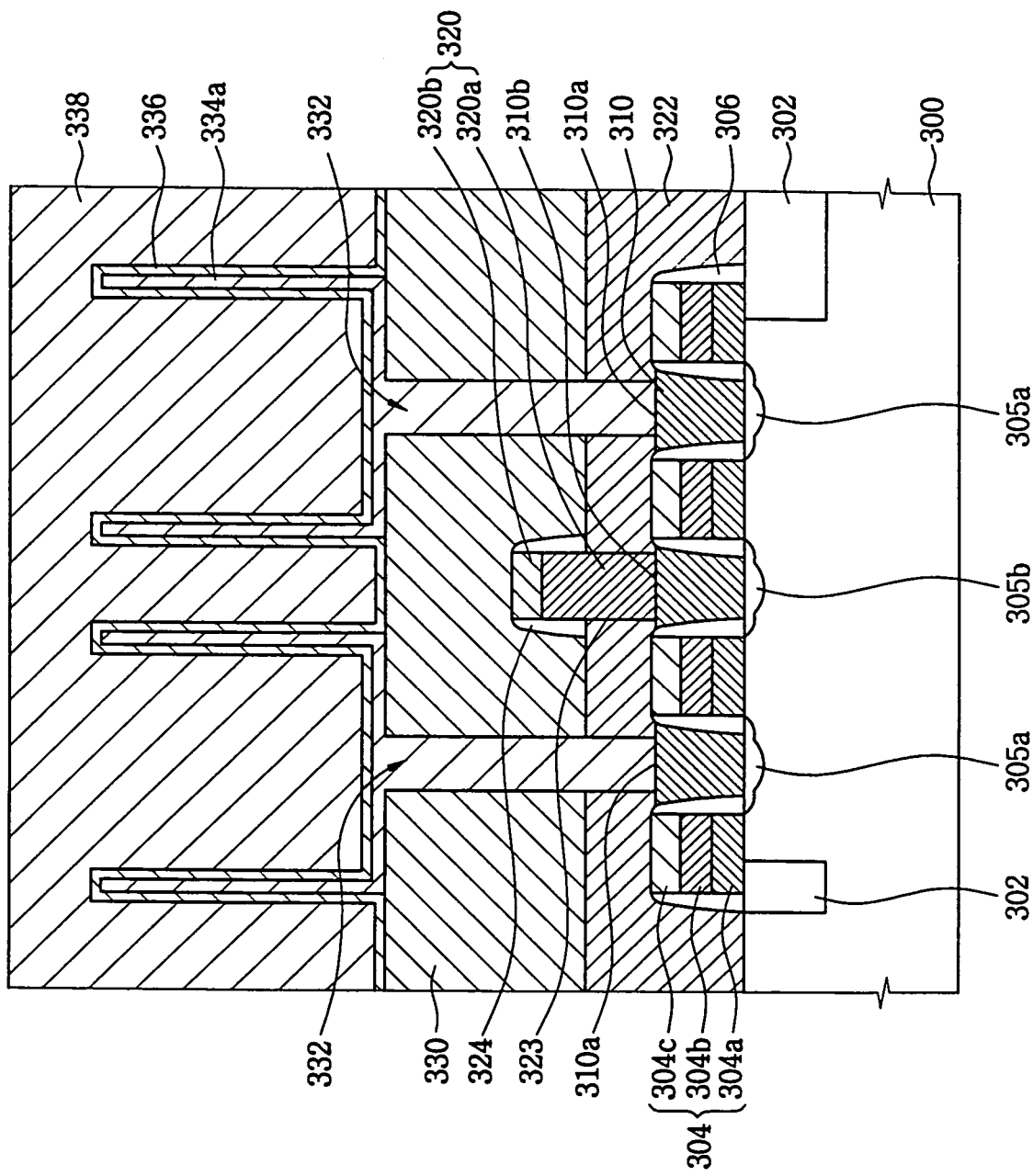

Referring to FIG. 8G, an upper electrode 338 is formed on the dielectric layer 336. The upper electrode 338 includes tantalum nitride, polysilicon, ruthenium, platinum, iridium, titanium nitride, tantalum nitride or tungsten nitride. When the upper electrode 338 includes tantalum nitride, the upper electrode 338 may be formed by a process substantially identical to that for forming the first lower electrode layer.

As a result, the capacitor including the lower electrode 334a, the dielectric layer 336 and the upper electrode 338 is completed. The lower electrode 334a including tantalum nitride are readily formed in accordance with the present invention. Therefore, the capacitor of the present invention includes the dielectric layer 336 that has metal oxide having a high dielectric constant.

Methods for forming a capacitor in accordance with some embodiments of the present invention may include the following.

A trench structure is formed in a substrate by an isolation process to divide the substrate into an active region and an inactive region. Impurities are implanted into the substrate to form a P type well and an N type well. A gate pattern including a polysilicon layer, tungsten suicide layer and a silicon nitride layer is formed on the active region of the substrate. Additionally, a gate spacer may be formed on a sidewall of the gate pattern.

Impurities are implanted into the substrate using the gate pattern as an ion implanting mask to form source/drain regions and adjacent to the gate pattern. Accordingly, a transistor structure including the gate pattern and the source/drain regions is completed. The source region corresponds to the capacitor contact region, and the drain region corresponds to the bit line contact region.

A space between the gate pattern is filled with a polysilicon layer to form a capacitor contact pad electrically contacted with the lower electrode of the capacitor and a bit line contact pad electrically contacted with the bit line structure.

A first insulating interlayer is formed on the gate pattern and the polysilicon layer. The first insulating interlayer is partially etched by a typical photolithography process to form a bit line contact hole exposing an upper face of the bit line contact pad. A tungsten layer is formed on the first insulating interlayer to fill the bit line contact hole. A silicon nitride layer is formed on the tungsten layer. The tungsten layer and the silicon nitride layer are partially etched by a typical photolithography process to form the bit line structure including the tungsten layer and the silicon nitride layer.

A silicon nitride layer is formed on the bit line structure and the first insulating interlayer. The silicon nitride layer is etched to form a spacer structure on a sidewall of the bit line structure. A second insulating interlayer including silicon oxide is formed on the bit line structure, the spacer structure and the first insulating interlayer. The first and second insulating interlayers are etched to form a self-align contact hole exposing an upper face of the capacitor contact pad.

The self-align contact hole is filled with the lower electrode layer of the capacitor. The lower electrode layer is etched by a typical photolithography process to form a lower electrode having a cylindrical shape. The lower electrode includes tantalum nitride, polysilicon, ruthenium, platinum, iridium, titanium nitride, tantalum nitride or tungsten nitride.

A dielectric layer is formed on the lower electrode. The dielectric layer includes metal oxide accordance with the present invention. The dielectric layer includes tantalum oxide ($Ta_2O_5$), titanium oxide ($TiO_2$), hafnium oxide ($HfO_2$), zirconium oxide ($ZrO_2$), aluminum oxide ($Al_2O_3$), yttrium oxide ($Y_2O_3$), niobium oxide ($Nb_2O_5$), cesium oxide ($CeO_2$), indium oxide ($InO_3$), iridium oxide ($IrO_2$), $SrTiO_3$, $PbTiO_3$, $SrRuO_3$, $CaRuO_3$, $(Ba, Sr)TiO_3$, $Pb(Zr, Ti)O_3$, $(Pb, La)(Zr, Ti)O_3$ or $(Sr, Ca)RuO_3$.

An upper electrode is formed on the dielectric layer 336. The upper electrode includes tantalum nitride. The upper electrode including tantalum nitride may be formed by an ADL process or a CVD process. This may allow for the completion of the capacitor including the lower electrode, the dielectric layer and the upper electrode. The upper electrode including tantalum nitride is readily formed in accordance with the present invention. Therefore, the capacitor of the present invention includes the dielectric layer that has metal oxide having a high dielectric constant.

The present invention is explained in greater detail in the Examples that follow. These examples are intended as illustrative of the invention and are not to be taken as limiting thereof.

EXAMPLES

Gate electrodes were formed using various methods including the method of the present invention. Work functions of the gate electrodes were measured. The measured work functions were showed in following Table 1. In Table 1, I→A represented inversion→accumulation. A→I represented accumulation→inversion. Delta indicated a difference between I→A and A→I. Delta had originally a substantially same value. However, delta had a different value according to a direction of applied voltage due to an oxide trap charge. This was called as hysteresis. The work functions were measured from I→A or A→I. A standard work function of TiN was 4.7 eV. A standard work function of poly was 4.1 eV.

TABLE 1

| Electrode | I→A | A→I | Delta | Work function |
| --- | --- | --- | --- | --- |
| P-TiN (Ti-rich) | −0.36 | −0.33 | 30 | 4.75 |
| P-TiN (N-rich) | −0.42 | −0.33 | 110 | 4.69 |
| P-TaN (Ta-rich) | −0.8 | −0.78 | 20 | 4.31 |
| P-TaN (N-rich) | −0.72 | −0.73 | 10 | 4.39 |
| P-Ta | −0.79 | −0.79 | 0 | 4.32 |
| A-TaN of 100 Å | −0.62 | −0.62 | 0 | 4.49 |
| A-TaN of 200 Å | −0.66 | −0.67 | 10 | 4.45 |
| C-TaN of 200 Å | −0.34 | −0.35 | 10 | 4.77 |
| A-TaN of 400 Å | −0.85 | −0.83 | 20 | 4.26 |
| Poly | −1.03 | −1.32 | 290 | 4.08 |

Figure 9:
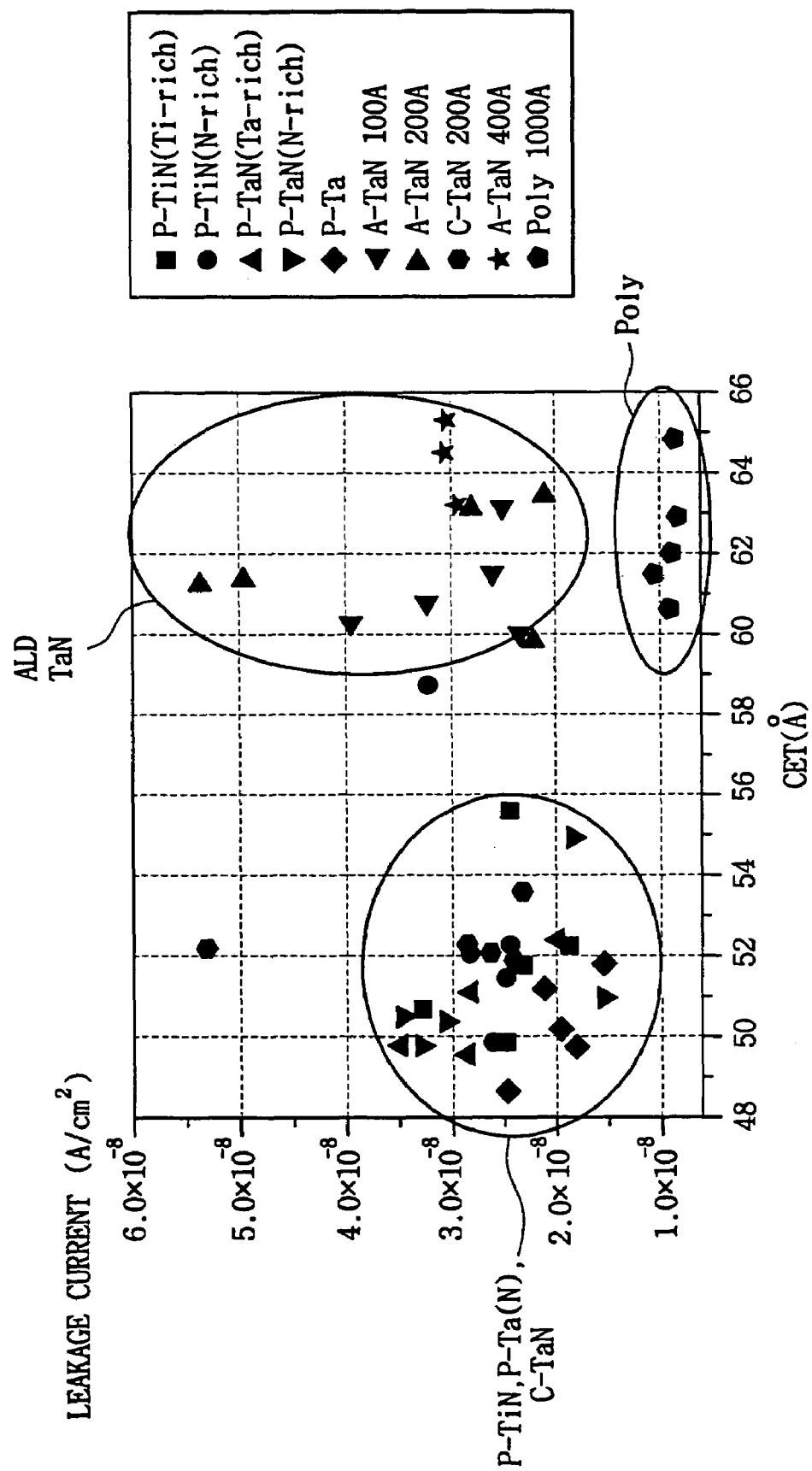
FIG. 9 is a graph showing a leakage current relative to a capacitance measured equivalent oxide thickness (CET) in various gate electrodes.

FIG. 9 is a graph showing a leakage current relative to a capacitance measured equivalent oxide thickness (CET) in various gate electrodes. An electrode having a low CET and a low leakage current had improved characteristic. As shown in FIG. 9, it could be noted that a CVD-TaN electrode had improved characteristic compared to an ALD-TaN electrode.

Figure 10:
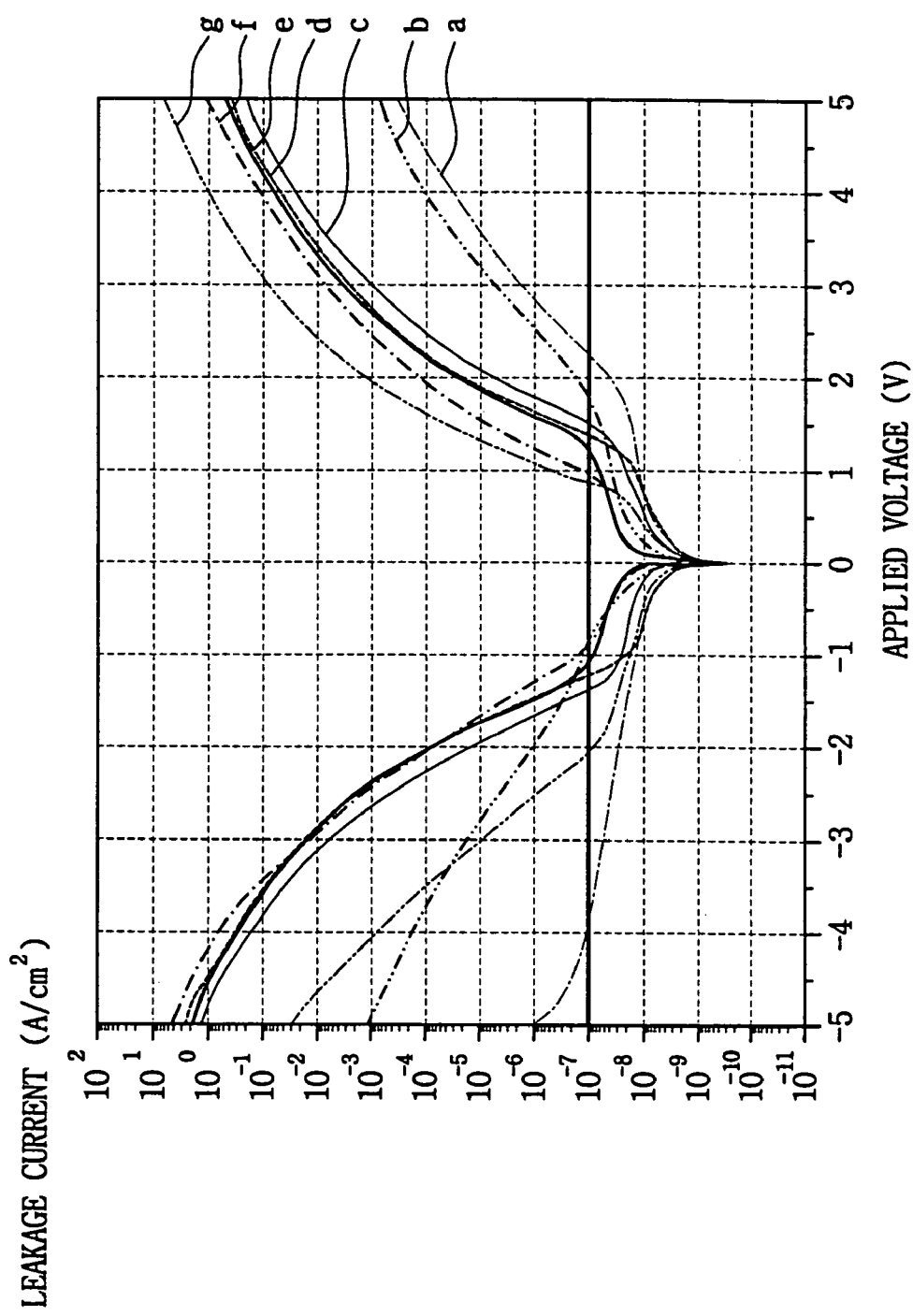
FIG. 10 is a graph showing a leakage current relative to a voltage applied to various capacitors.

FIG. 10 is a graph showing a leakage current relative to a voltage applied to various capacitors. In FIG. 10, a curved line indicated a TaN electrode having a thickness of about 200 Å and having a CET of about 560 C-19.3 Å. A curved line b indicated a CVD TaN electrode having a thickness of about 200 Å and having a CET of about 54.3 Å. A curved line c indicated a TaN electrode having a thickness of about 100 Å and having a CET of about 250C-24.8 Å. A curved line d indicated a TaN electrode having a thickness of about 200 Å and having a CET of about 26.9Å. A curved line e indicated a TaN electrode having a thickness of about 400 Å and having a CET of about 24.6 Å. A curved line f indicated a TiN electrode having a thickness of about 200 Å and having a CET of about 560C-19.3 Å. A curved line g indicated a TiN electrode having a thickness of about 200 Å and having a CET of about 450C-18.4 Å. As shown in FIG. 10, it could be noted that the capacitor of the present invention had a low leakage current.

According to the present invention, the tantalum nitride layer is used as the metal barrier pattern in the process for forming the gate electrode. Since the tantalum nitride layer has improved reactivity-resistance relative to the dielectric layer having a high dielectric constant, the gate structure has excellent electrical characteristic. Further, the dual gate electrode having the improved gate insulating layer and the metal gate electrode may be manufactured.

Additionally, the electrode of the capacitor includes tantalum nitride so that metal oxide is used for the dielectric layer. The reaction between the electrode layer and the dielectric layer is also prevented so that the dielectric constant of the dielectric layer is constantly maintained. As a result, the reliability of a semiconductor device is improved.

Having described the preferred embodiments of the present invention, it is noted that modifications and variations can be made by persons skilled in the art in light of the above teachings. It is therefore to be understood that changes may be made in the particular embodiment of the present invention disclosed which is within the scope and the spirit of the invention outlined by the appended claims.

What is claimed is:

1. A method for forming a gate electrode comprising:
   forming a dielectric layer having a high dielectric constant on a substrate;
   thermally treating the substrate at a sufficient temperature to remove impurities from the dielectric layer, modify stoichiometry within the dielectric layer and/or increase a degree of crystallinity within the dielectric layer;
   providing a tantalum amine derivative to the dielectric layer and introducing a reacting gas comprising at least one of $H_2$, $N_2$, $NH_3$, $SiH_4$ or $Si_2H_6$ to the dielectric layer to form a metal barrier layer having a work function of about 3.9 eV to about 5.5 eV wherein the tantalum amine derivative comprises $Ta(NC(CH_3)_2C_2H_5)(N(Ch_3)_2)_3)$
   forming a gate metal layer on the metal barrier layer; and
   patterning the gate metal layer and the metal barrier layer to form a gate metal pattern and a metal barrier pattern.

2. The method according to claim 1, wherein forming the metal barrier layer comprises a deposition process selected from the group consisting of a chemical vapor deposition (CVD) process, a plasma enhanced chemical vapor deposition (PECVD) process, an atomic layer deposition (ALD) process, and a radical assisted atomic layer deposition (RAALD) process.

3. The method according to claim 1, wherein the dielectric layer is selected from the group consisting of tantalum oxide ($Ta_2O_5$), titanium oxide ($TiO_2$), hafnium oxide ($HfO_2$), zirconium oxide ($ZrO_2$), aluminum oxide ($Al_2O_3$), yttrium oxide ($Y_2O_3$), niobium oxide ($Nb_2O_5$), cesium oxide ($CeO_2$), indium oxide ($InO_3$), iridium oxide ($IrO_2$), lanthanum oxide ($LaO_2$), barium strontium titanium (BST) and lead zirconium titanate (PZT).

4. The method according to claim 1, wherein the dielectric layer is formed by a chemical vapor deposition (CVD) process, an atomic layer deposition (ALD) process or a physical vapor deposition (PVD) process.

5. The method according to claim 1, wherein the tantalum amine derivative is introduced at a temperature of about 100° C. to 650° C. under a pressure of about 0.01 Torr to 30 Torr.

6. The method according to claim 1, further comprising post-treating the metal barrier layer by activating by remote plasma or direct plasma a material selected from the group consisting of $H_2$, $N_2$, $NH_3$, $SiH_4$ and $Si_2H_6$.

7. The method according to claim 1, wherein the gate metal layer comprises polysilicon.

8. The method according to claim 1, wherein the gate metal layer is selected from the group consisting of tungsten, tantalum, titanium, aluminum, copper, titanium silicide, cobalt silicide, nickel silicide, tungsten nitride, tantalum nitride and titanium nitride.

9. The method according to claim 1, wherein the gate metal layer is formed by a physical vapor deposition (PVD) process, a chemical vapor deposition (CVD) process, an atomic layer deposition (ALD) process or a silicidation process.

10. The method according to claim 1, further comprising exposing an upper face of the substrate that corresponds to a position on which the metal barrier layer is formed to form a mold pattern on the substrate before forming the dielectric layer.

11. The method according to claim 10, wherein forming the metal barrier pattern and the gate metal pattern comprises:
    etching the gate metal layer, the metal barrier layer and the dielectric layer to expose an upper face of the mold pattern to form the gate metal pattern, the metal barrier pattern and a dielectric layer pattern disposed in the exposed face; and removing the mold pattern.

12. The method according to claim 11, further comprising etching the mold pattern with an etchant that comprises an etching selectivity relative to the metal barrier pattern, the gate metal pattern and the dielectric layer pattern.

13. The method according to claim 11, wherein the mold pattern is isotropically etched.

14. A method for forming a gate electrode comprising:
    forming a dielectric layer having a high dielectric constant on a substrate;
    thermally treating the substrate at a sufficient temperature to remove impurities from the dielectric layer, modify stoichiometry within the dielectric layer and/or increase a degree of crystallinity within the dielectric layer;
    forming a gate metal layer having a work function of about 3.9 eV to about 5.5 eV on the dielectric layer, by introducing a tantalum amine derivative comprising $Ta(NC(CH_3)_2C_2H_5)(N(CH_3)_2)_3)$ and a reacting gas comprising at least one of $H_2$, $N_2$, $NH_3$, $SiH_4$ or $Si_2H_6$ to the dielectric layer; and
    patterning the gate metal layer to form a gate metal pattern.

15. The method according to claim 14, wherein forming the gate metal layer comprises a deposition process selected from the group consisting of a CVD process, a PECVD process, an ALD process and a RAALD process.

16. The method according to claim 14, wherein the dielectric layer is selected from the group consisting of tantalum oxide ($Ta_2O_5$), titanium oxide ($TiO_2$), hafnium oxide ($HfO_2$), zirconium oxide ($ZrO_2$), aluminum oxide ($Al_2O_3$), yttrium oxide ($Y_2O_3$), niobium oxide ($Nb_2O_5$), cesium oxide ($CeO_2$), indium oxide ($InO_3$), iridium oxide ($IrO_2$), lanthanum oxide ($LaO_2$), barium strontium titanium (BST) and lead zirconium titanate (PZT).

17. The method according to claim 14, wherein the dielectric layer is formed by a chemical vapor deposition (CVD) process, an atomic layer deposition (ALD) process or a physical vapor deposition (PVD) process.

18. The method according to claim 14, further comprising introducing the tantalum amine derivative at a temperature of about 100° C. to 650° C. under a pressure of about 0.01 Torr to 30 Torr.

19. The method according to claim 14, further comprising post-treating the gate metal layer by activating by remote plasma or direct plasma a material selected from the group consisting of $H_2$, $N_2$, $NH_3$, $SiH_4$ and $Si_2H_6$.

* * * * *